US012610677B2

(12) United States Patent
Aoki et al.

(10) Patent No.: US 12,610,677 B2
(45) Date of Patent: Apr. 21, 2026

(54) DISPLAY DEVICE

(71) Applicant: Japan Display Inc., Tokyo (JP)

(72) Inventors: Yoshinori Aoki, Tokyo (JP); Gen Koide, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 391 days.

(21) Appl. No.: 18/325,145

(22) Filed: May 30, 2023

(65) Prior Publication Data

US 2023/0387374 A1 Nov. 30, 2023

(30) Foreign Application Priority Data

May 30, 2022 (JP) ................................ 2022-087601

(51) Int. Cl.
| | |
|---|---|
| *H01L 27/12* | (2006.01) |
| *H01L 25/075* | (2006.01) |
| *H01L 25/16* | (2023.01) |
| *H10D 86/40* | (2025.01) |
| *H10D 86/60* | (2025.01) |
| *H10H 20/857* | (2025.01) |
| *H10H 29/14* | (2025.01) |

(52) U.S. Cl.
CPC ....... *H10H 20/857* (2025.01); *H01L 25/0753* (2013.01); *H01L 25/167* (2013.01); *H10D 86/441* (2025.01); *H10D 86/60* (2025.01); *H10H 29/142* (2025.01)

(58) Field of Classification Search
CPC ............. H10H 20/857; H10H 20/8583; H10H 20/821; H10H 20/831; H10H 20/819; H10H 29/142; H10H 29/14; H10H 29/10; H01L 25/0753; H01L 25/075; H01L 25/167; H01L 25/16; H10D 86/441; H10D 86/40; H10D 86/60; G09G 3/32; G09G 3/3223; G09G 2300/0426; G09G 2300/0852; G09G 2300/0819
See application file for complete search history.

(56) References Cited

U.S. PATENT DOCUMENTS

2022/0285332 A1 9/2022 Aoki et al.

FOREIGN PATENT DOCUMENTS

JP 2021-085904 A 6/2021

*Primary Examiner* — Nikolay K Yushin
(74) *Attorney, Agent, or Firm* — XSENSUS LLP

(57) ABSTRACT

According to one embodiment, a display device includes a display panel, a first wiring substrate, and a first conductive material. The display panel includes a basement located in a display area and a non-display area, a plurality of pixels arranged above the basement and located in the display area, a plurality of pads arranged above the basement and located in the non-display area, and a first power line arranged above the basement, located between the display area and the plurality of pads in the non-display area, and including the first connection surface.

12 Claims, 16 Drawing Sheets

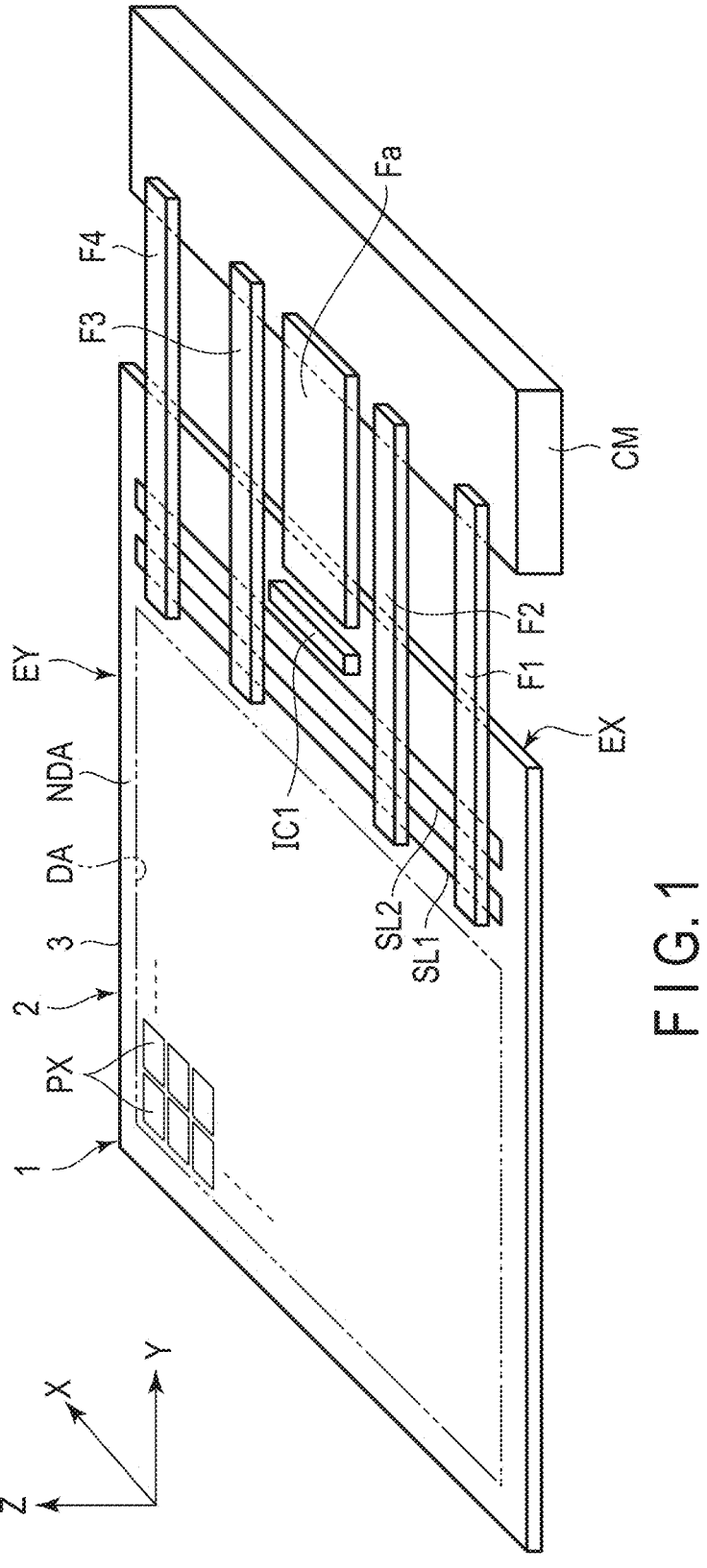
F I G. 1

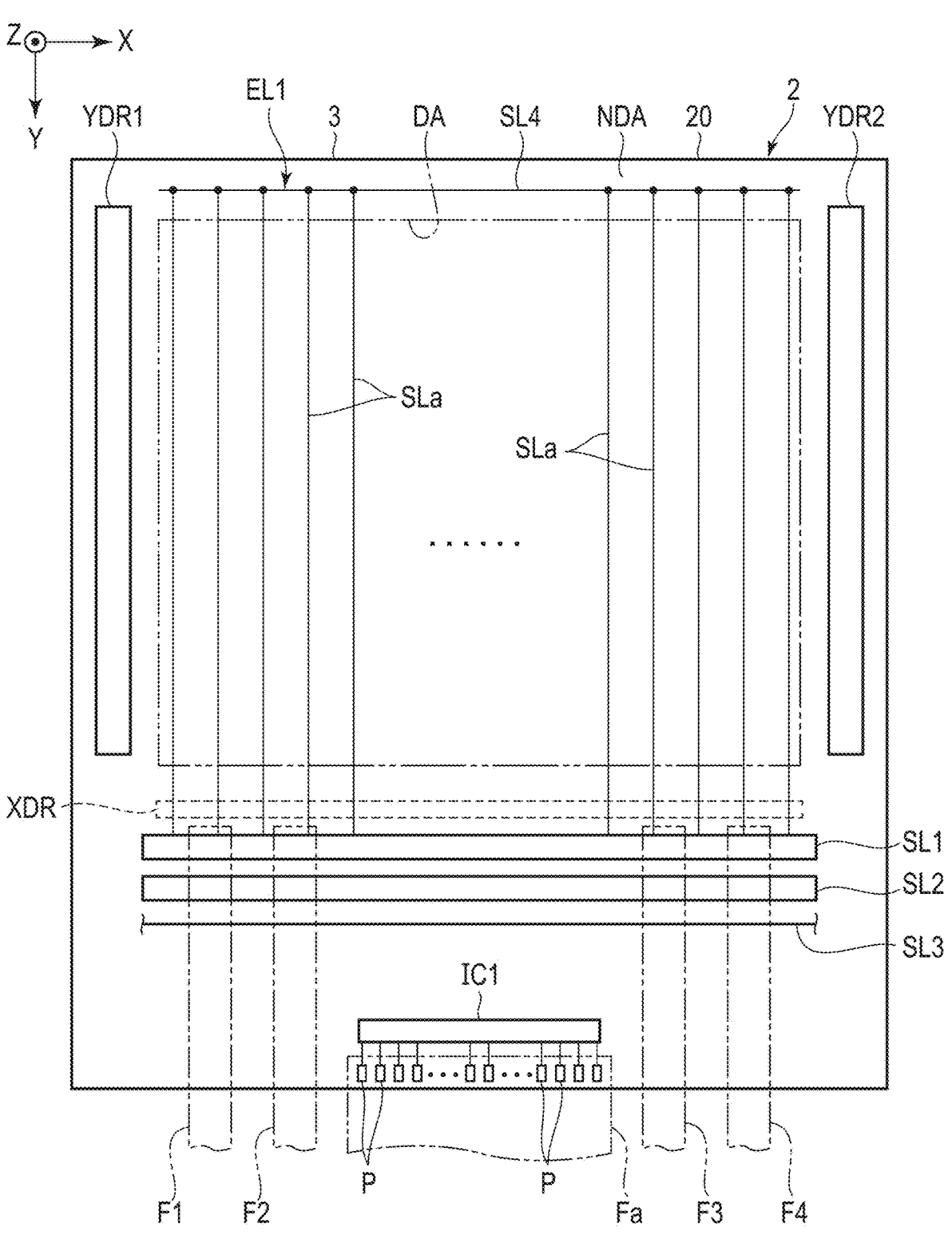
F I G. 3

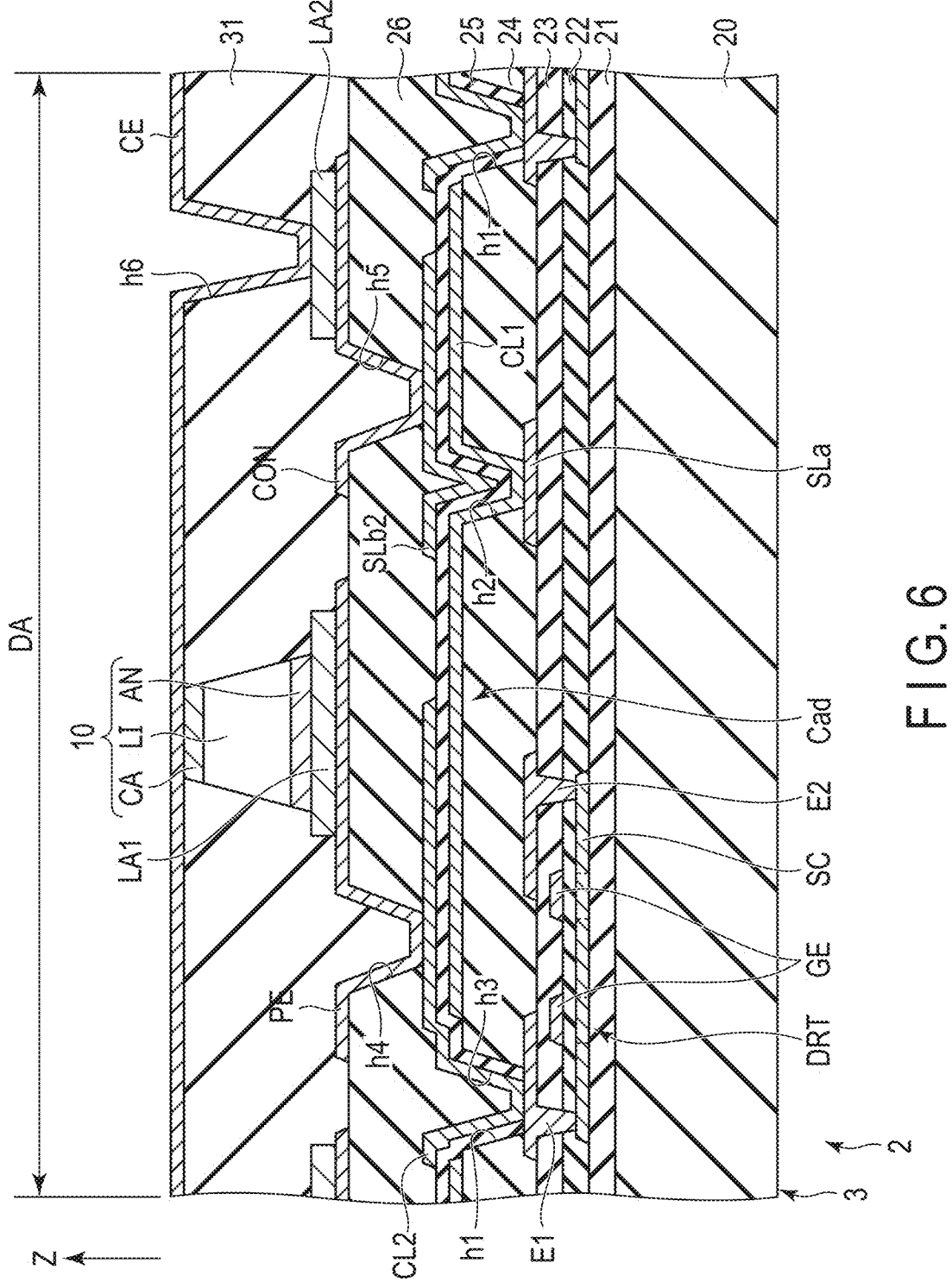
F I G. 6

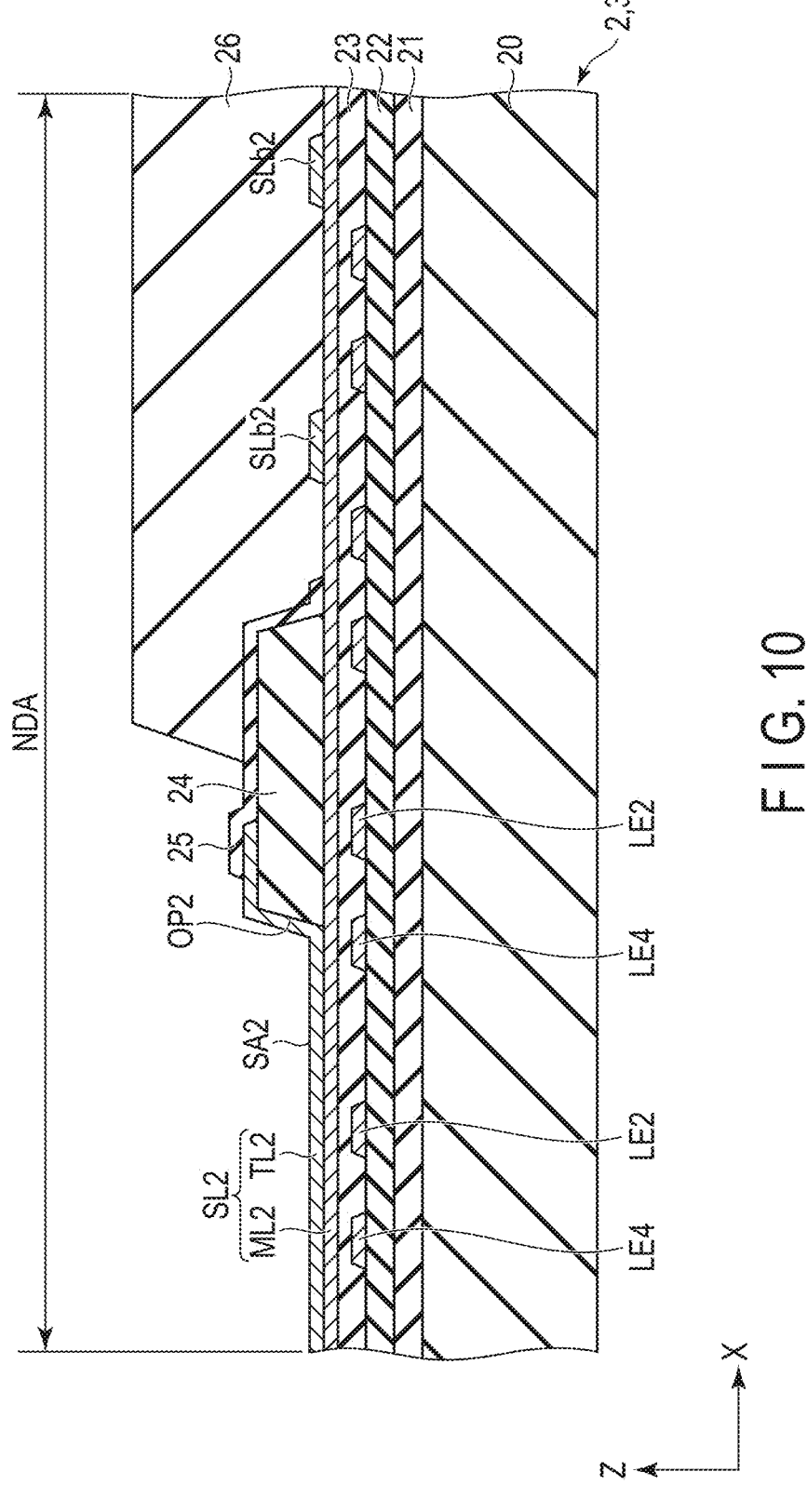
F I G. 10

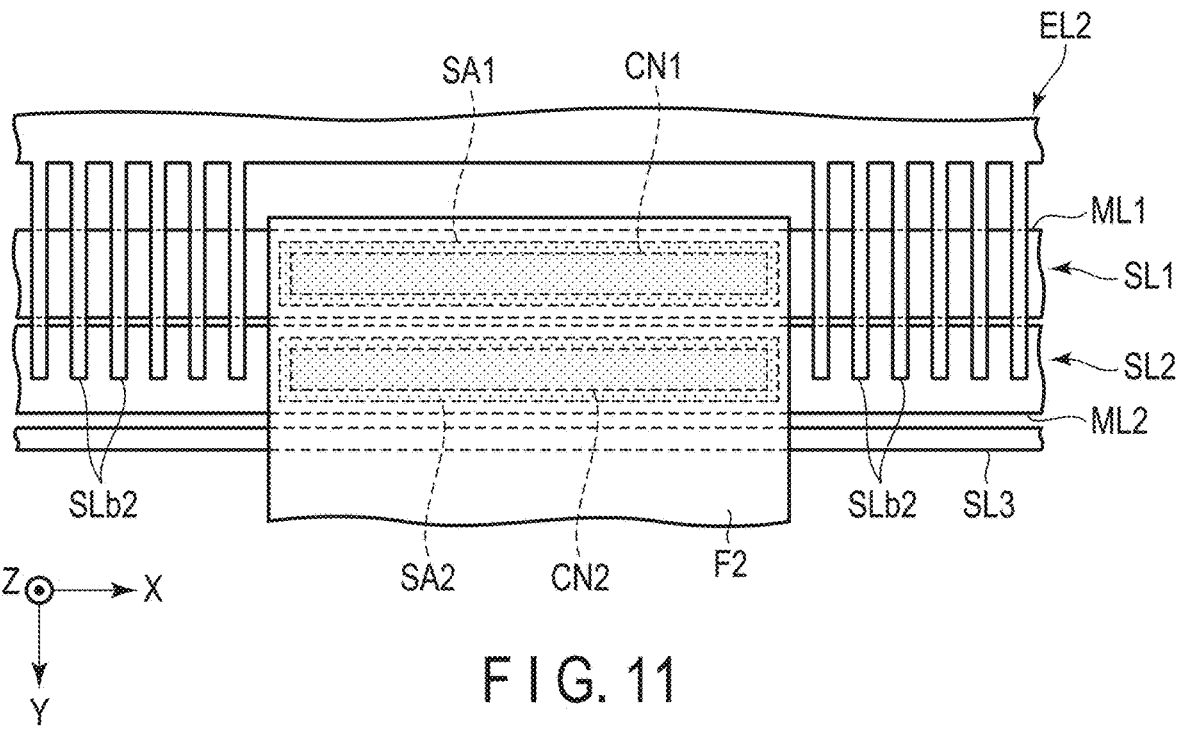
F I G. 11
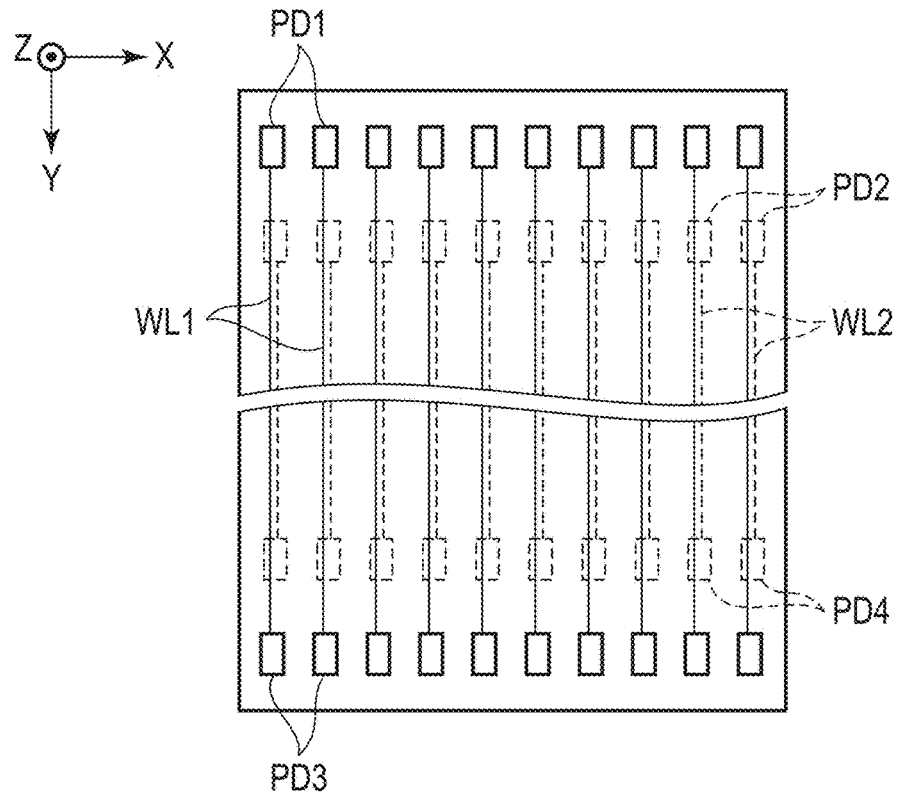
F I G. 12

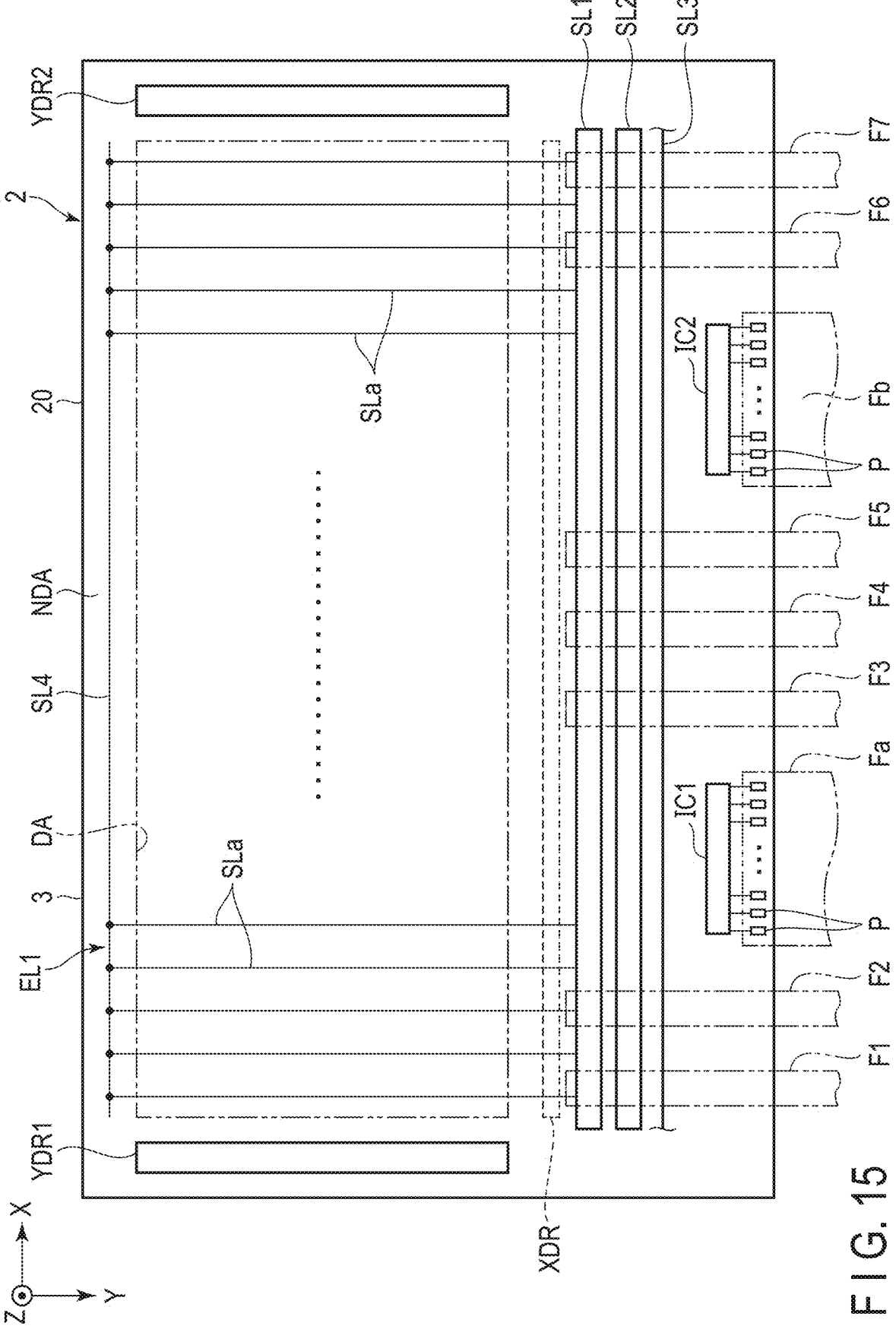
F I G. 15

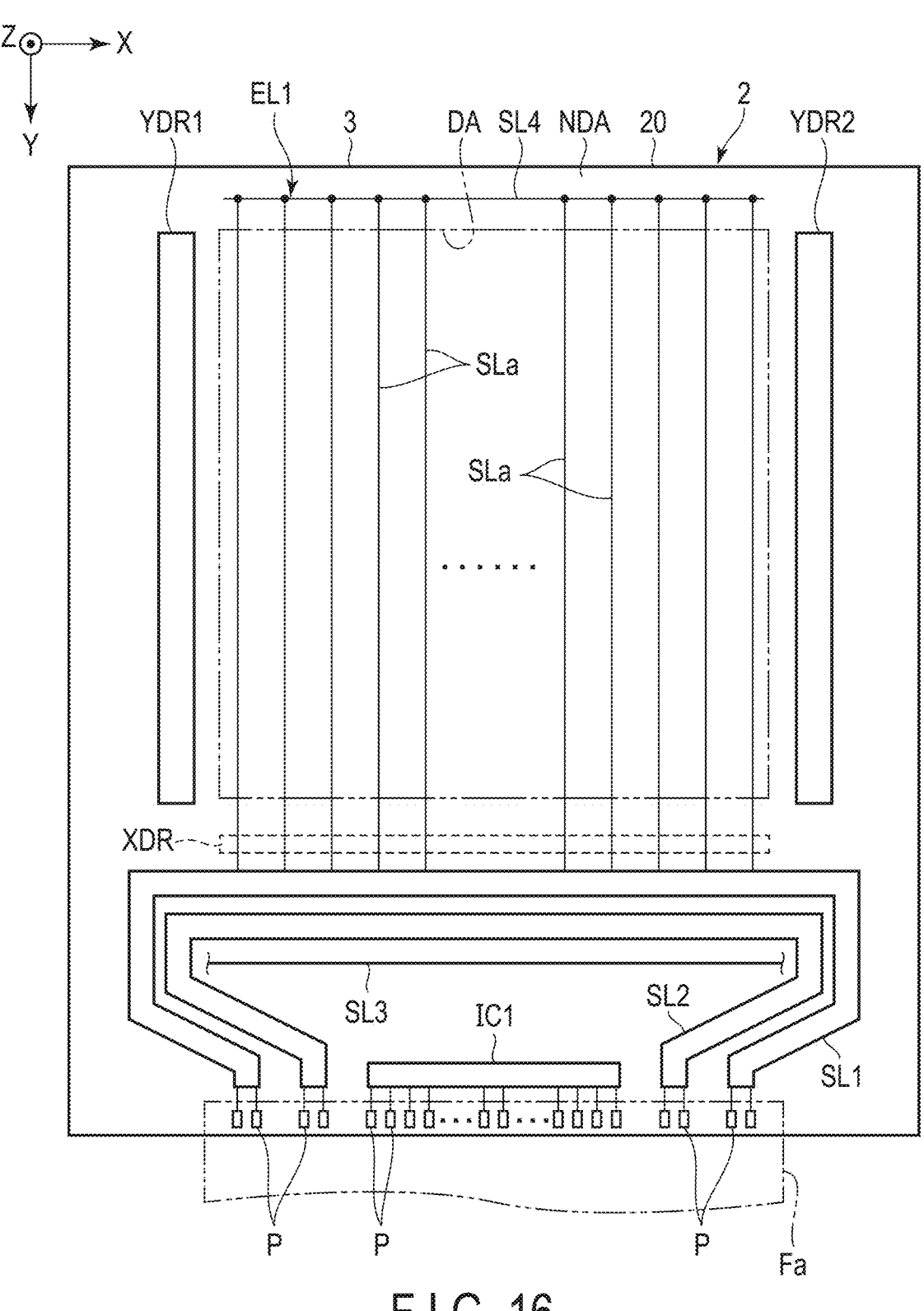
F I G. 16

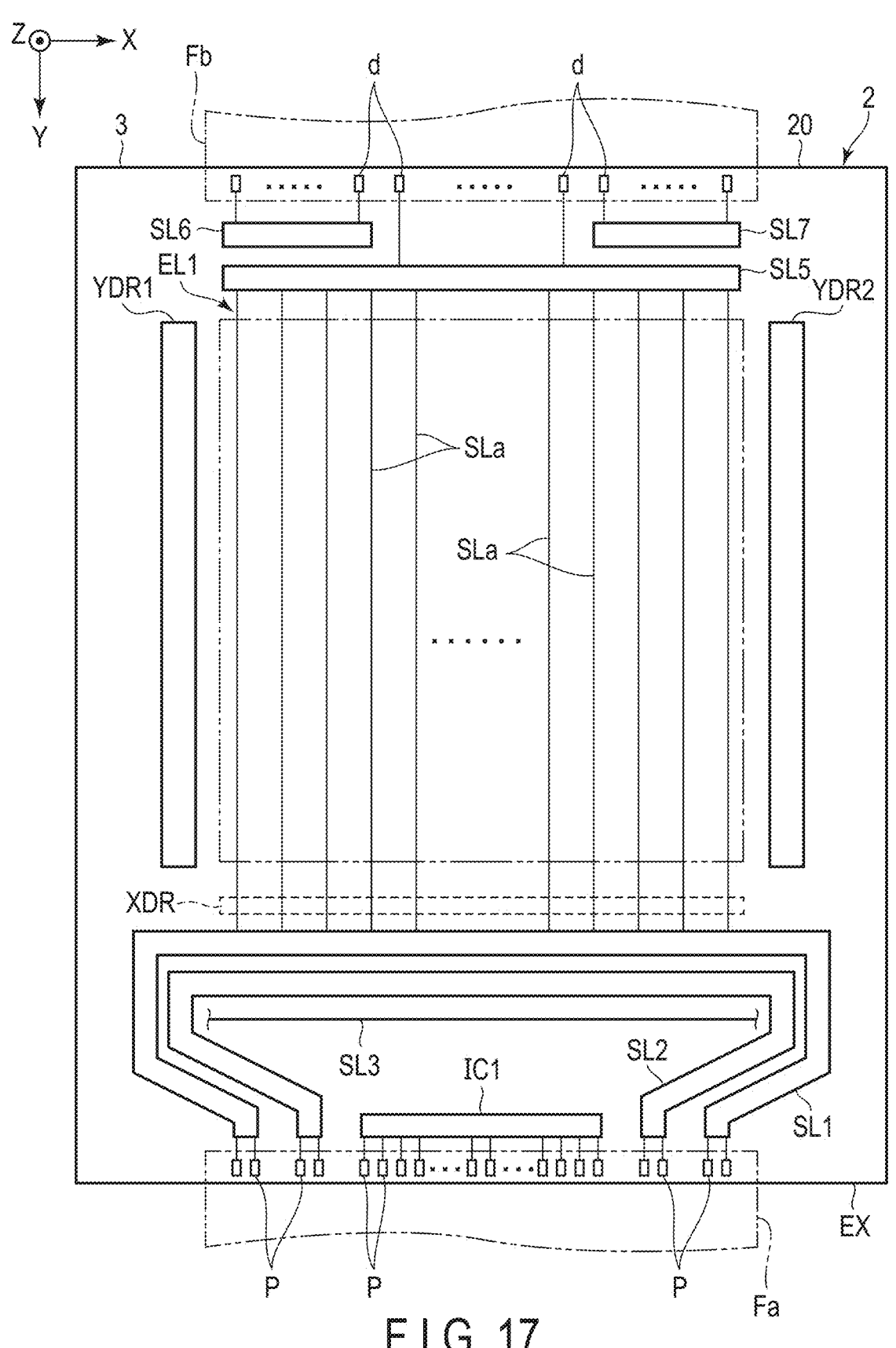
F I G. 17

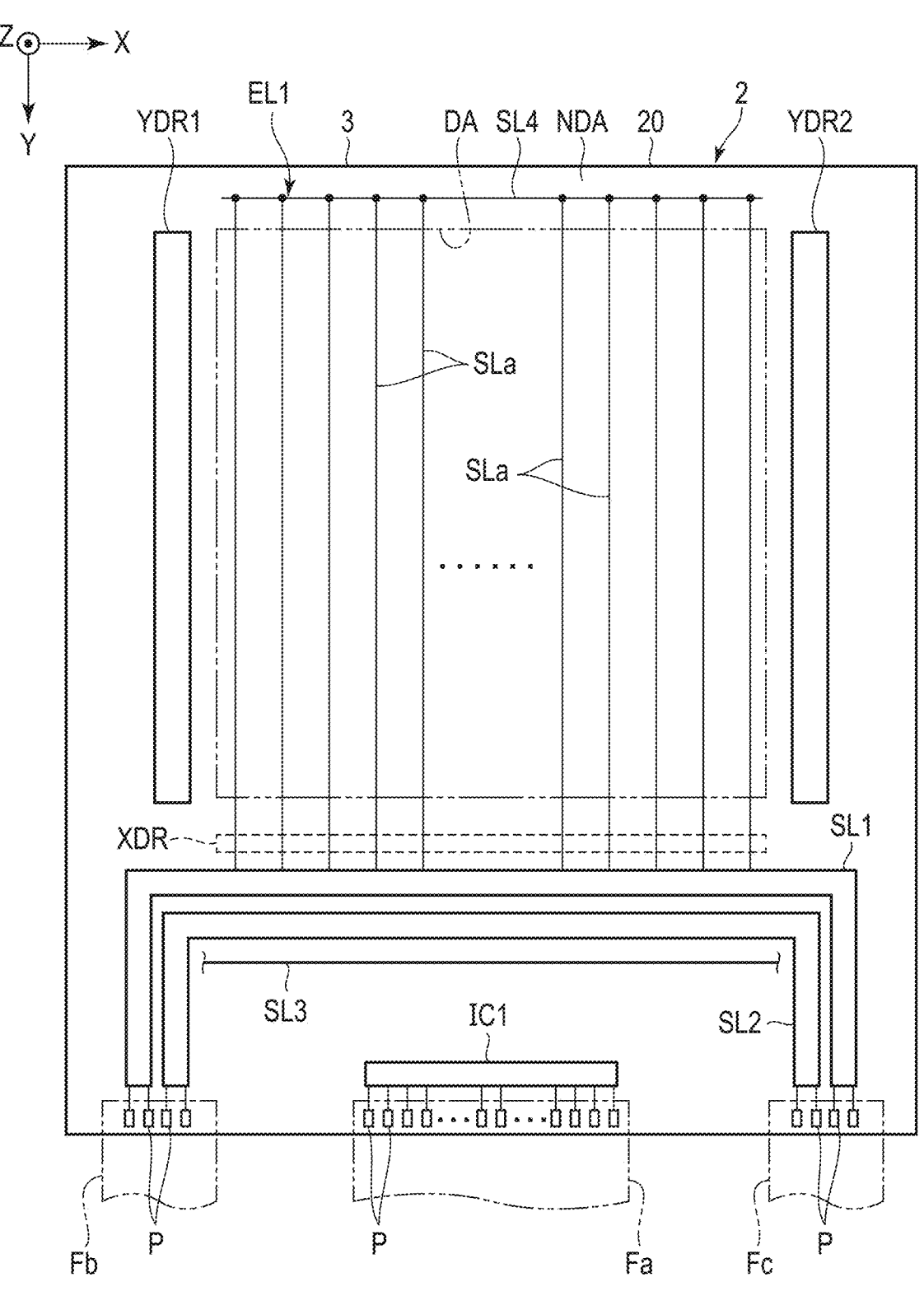
F I G. 18

DISPLAY DEVICE

CROSS-REFERENCE TO RELATED APPLICATIONS

This application is based upon and claims the benefit of priority from Japanese Patent Application No. 2022-087601, filed May 30, 2022, the entire contents of which are incorporated herein by reference.

FIELD

Embodiments described herein relate generally to a display device.

BACKGROUND

LED display panels using light emitting diodes (LED) that are self-luminous elements are known as display panels. Recently, a display panel (hereinafter referred to as a micro-LED display panel) in which minute light emitting diodes referred to as micro-LEDs are mounted on an array substrate has been developed as a higher definition display panel.

Since the micro-LED display is formed such that a large number of chip-like micro-LEDs are mounted in a display area, unlike the liquid crystal display or organic EL display, both higher definition and larger scale of the display can easily be achieved and the display is focused as a next generation display panel.

BRIEF DESCRIPTION OF THE DRAWINGS

FIG. 1 is a perspective view showing a configuration of a display device according to one of embodiments.

FIG. 2 is a circuit diagram showing the display device, including a plurality of scanning lines, a plurality of signal lines, a first power line, a second power line, a plurality of extension lines, a plurality of lead lines, a plurality of peripheral lines, and the like.

FIG. 3 is another circuit diagram showing the display device, illustrating a first electrode, and the like.

FIG. 4 is yet another circuit diagram showing the display device, illustrating a second electrode, and the like.

FIG. 5 is a circuit diagram showing a display panel of the embodiment, and equivalent circuit diagram showing sub-pixel, and the like.

FIG. 6 is a partially cross-sectional view showing a display area of the display panel.

FIG. 9 is a partially cross-sectional view showing the display panel shown in FIG. 8, illustrating the first power line, and the like.

FIG. 10 is a cross-sectional view showing the display panel shown in FIG. 7 along line X-X.

FIG. 11 is a plan view showing parts of the display panel, illustrating the first power line, the second power line, a control line, the second electrode, the wiring substrate, and a plurality of conductive materials.

FIG. 12 is a plan view showing the wiring substrate of FIG. 11, illustrating a plurality of wiring lines and a plurality of pads.

FIG. 15 is a circuit diagram showing a display device according to modified example 2 of the embodiment, illustrating a first electrode, and the like.

FIG. 16 is a circuit diagram showing a display device according to comparative example 1, illustrating a first electrode, a first power line, a second power line, and the like.

FIG. 17 is a circuit diagram showing a display device according to comparative example 2, illustrating a first electrode, a plurality of first power lines, a plurality of second power lines, and the like.

FIG. 18 is a circuit diagram showing a display device according to comparative example 3, illustrating a first electrode, a first power line, a second power line, and the like.

DETAILED DESCRIPTION

Figure 2:
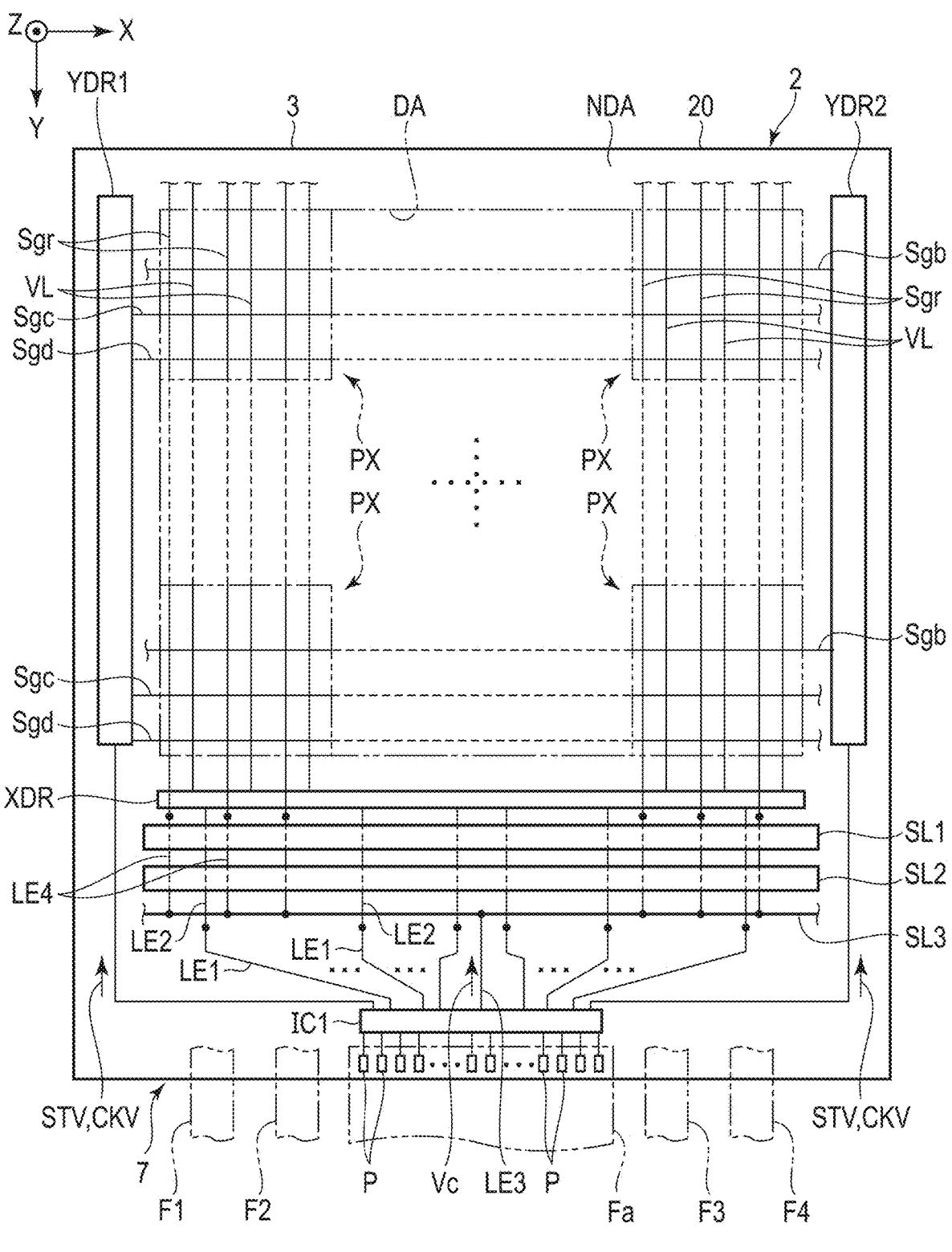

In general, according to one embodiment, there is provided a display device comprising: a display panel including: a basement located in a display area and a non-display area outside the display area; a plurality of pixels arranged above the basement and located in the display area; a plurality of pads arranged above the basement and located in the non-display area; and a first power line arranged above the basement, located between the display area and the plurality of pads in the non-display area, and including the first connection surface; a first wiring substrate opposed to the first connection surface; and a first conductive material located between the first connection surface and the first wiring substrate to connect the first power line with the first wiring substrate.

Embodiment and modified examples will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

EMBODIMENT

First, a display device according to an embodiment will be described. FIG. 1 is a perspective view showing a configuration of a display device 1 according to the embodiment. FIG. 1 illustrates a three-dimensional space which is defined by a first direction X, a second direction Y orthogonal to the first direction X, and a third direction Z orthogonal to the first direction X and the second direction Y. The first direction X and the second direction Y are orthogonal to each other, but may intersect at an angle other than 90 degrees. In addition, the third direction Z is defined as an upper or upward direction while a direction opposite to the third direction Z is defined as a lower or downward direction, in the present embodiment. Expressions such as "a second component above a first component" and "a second component below a first component" mean that the second component may be in contact with the first component or may be located separately from the first component.

In the embodiment, an example where the display device 1 is a micro-LED display device using a micro-light-emitting diode hereinafter referred to as a micro-light emitting diode (micro-LED), which is a self-luminous element, will be mainly described below.

As shown in FIG. 1, the display device 1 comprises a display panel 2, a driver IC chip IC1, a wiring substrate F1, a wiring substrate F2, a wiring substrate F3, a wiring substrate F4, a wiring substrate Fa, a control module CM, and the like.

The display panel 2 has, for example, a rectangular shape. In the example illustrated, a first side EX of the display panel 2 is parallel to the first direction X, and second sides EY of the display panel 2 are parallel to the second direction Y. The third direction Z corresponds to a thickness direction of the display panel 2. The main surface of the display panel 2 is parallel to an X-Y plane defined by the first direction X and the second direction Y. The display panel 2 includes a display area DA and a non-display area NDA other than the display area DA. In the example illustrated, the non-display area NDA is an area outside the display area DA and surrounds the display area DA. The display area DA is an area where images are displayed.

The display panel 2 includes a plurality of pixels PX located in the display area DA. For example, the plurality of pixels PX are arrayed in a matrix in the first direction X and the second direction Y. In the present embodiment, the shape of the display area DA is a quadrangle, but the shape is not limited to this but may be a polygon other than the quadrangle, a circle, or the like. In addition, the size of the display area DA is larger than the size of the non-display area NDA but is not limited to this, and the size of the display area DA may be smaller than the size of the non-display area NDA.

An array substrate 3 of the display panel 2 comprises a first power line SL1 and a second power line SL2 located in the non-display area NDA. Each of the first power line SL1 and the second power line SL2 is electrically connected to the plurality of pixels PX.

The driver IC chip IC1 is mounted on the non-display area NDA of the array substrate 3. The driver IC chip IC1 is electrically connected to the plurality of pixels PX and configured to drive the plurality of pixels PX.

Each of the wiring substrate F1, the wiring substrate F2, the wiring substrate F3, the wiring substrate F4, and the wiring substrate Fa is coupled to the array substrate 3 on one side, and coupled to the control module CM on the other side. Each of the wiring substrate F1, the wiring substrate F2, the wiring substrate F3, and the wiring substrate F4 is electrically connected to the first power line SL1 and the second power line SL2. For this reason, the control module CM can fix a potential of the first power line SL1 to a first potential and fix a potential of the second power line SL2 to a second potential via the wiring substrate F1, the wiring substrate F2, the wiring substrate F3, and the wiring substrate F4. As a result, the first power line SL1 can supply a first constant voltage to the plurality of pixels PX, and the second power line SL2 can supply a second constant voltage to the plurality of pixels PX.

The wiring substrate Fa is electrically connected to the driver IC chip IC1. For this reason, the control module CM can supply various signals (for example, video signals) to the driver IC chip IC1 via the wiring substrate Fa, control the drive of the driver IC chip IC1, and then control the drive of the plurality of pixels PX.

Each of the wiring substrate F1, the wiring substrate F2, the wiring substrate F3, the wiring substrate F4, and the wiring substrate Fa is a flexible wiring substrate. For example, each of the wiring substrate F1, the wiring substrate F2, the wiring substrate F3, the wiring substrate F4, and the wiring substrate Fa is formed of a flexible printed circuit (FPC). Each of the wiring substrate F1, the wiring substrate F2, the wiring substrate F3, the wiring substrate F4, and the wiring substrate Fa is a substrate which includes a plurality of wiring lines and a plurality of pads and to which electronic components are not attached.

However, each of the wiring substrate F1, the wiring substrate F2, the wiring substrate F3, the wiring substrate F4, and the wiring substrate Fa may be a rigid substrate such as a printed wiring board (PWB) or a printed circuit board (PCB), or a rigid flexible substrate which is a combination of the flexible substrate and the rigid substrate.

FIG. 2 is a circuit diagram showing the display device 1, illustrating a plurality of scanning lines Sgb, Sgc, and Sgd, a plurality of signal lines VL, the first power line SL1, the second power line SL2, a plurality of extension lines Sgr, a plurality of lead lines LE1, LE2, LE3, and LE4, a plurality of peripheral lines, and the like. Incidentally, not all of various lines are shown in FIG. 2.

As shown in FIG. 2, the display panel 2 comprises a basement (substrate) 20 having light transmittance and insulation properties, a plurality of pixels PX, various wiring lines, a scanning line driving circuits YDR1 and YDR2, a signal line driving circuit XDR, and a plurality of pads p of outer lead bonding (OLB). The plurality of pixels PX are arranged above the basement 20 and arrayed in a matrix in the first direction X and second direction Y in the display area DA.

The plurality of pads p are provided close to the first side EX of the non-display area NDA and are arranged in the first direction X. The plurality of pads p are arranged above the basement 20. The driver IC chip IC1 is provided on the array substrate 3 and is located between the display area DA and the plurality of pads p in the second direction Y. The driver IC chip IC1 is electrically connected to the plurality of pads p.

The scanning line driving circuit YDR1 and the scanning line driving circuit YDR2 are located in the non-display area NDA to sandwich the display area DA in the first direction X. The signal line driving circuit XDR is located in the non-display area NDA. The signal line driving circuit XDR is located between the display area DA and the driver IC chip IC1 in the second direction Y and is adjacent to the display area DA.

The various wiring lines include a plurality of first scanning lines Sgb, a plurality of second scanning lines Sgc, a plurality of third scanning lines Sgd, the plurality of signal lines VL, a plurality of extension lines Sgr, the first power line SL1, the second power line SL2, a control line SL3, and the plurality of lead lines LE1, LE2, LE3, and LE4.

The first power line SL1, the second power line SL2, and the control line SL3 extend in the first direction X and are provided to be spaced apart in the second direction Y. The first power line SL1, the second power line SL2, and the control line SL3 are located between the signal line driving circuit XDR and the driver IC chip IC1 in the second direction Y. Of the first power line SL1, the second power line SL2, and the control line SL3, the first power line SL1 is the closest to the signal line driving circuit XDR, the control line SL3 is the closest to the driver IC chip IC1, and the second power line SL2 is located between the first power line SL1 and the control line SL3.

The second scanning lines Sgc and the third scanning lines Sgd extend in the first direction X in the display area DA and are connected to the scanning line driving circuit YDR1 in the non-display area NDA. The first scanning lines Sgb extend in the first direction X in the display area DA and is connected to the scanning line driving circuit YDR2 in the non-display area NDA. Each of the first scanning lines Sgb, the second scanning lines Sgc, and the third scanning lines Sgd is located above the basement 20. Each of the first scanning lines Sgb, the second scanning lines Sgc, and the third scanning lines Sgd is electrically connected to the plurality of pixels PX aligned in the first direction X among the plurality of pixels PX.

The wiring substrate Fa is electrically connected to the plurality of pads p. The scanning line driving circuits YDR1 and YDR2 are electrically connected to the driver IC chip IC1. The scanning line driving circuits YDR1 and YDR2 are supplied with a start pulse signal STV, a clock signal CKV, and the like from the driver IC chip IC1. Incidentally, the control module CM may supply the start pulse signal STV, the clock signal CKV, and the like to the scanning line driving circuits YDR1 and YDR2, not via the driver IC chip IC1. The scanning line driving circuit YDR1 is configured to drive the second scanning lines Sgc and the third scanning lines Sgd, based on the signals such as the start pulse signal STV and the clock signal CKV. Similarly, the scanning line driving circuit YDR2 is configured to drive the first scanning lines Sgb.

The signal lines VL extend in the second direction Y in the display area DA and are connected to the signal line driving circuit XDR in the non-display area NDA. The signal line driving circuit XDR is composed of a selection circuit. The scanning line driving circuits YDR1 and YDR2 and the signal line driving circuit XDR are formed above the basement 20 in the non-display area NDA and constitutes a driver 7 together with the driver IC chip IC1. The signal lines VL are located above the basement 20. Each of the signal lines VL is electrically connected to the plurality of pixels PX aligned in the second direction Y among the plurality of pixels PX.

The extension lines Sgr extend in the second direction Y in the display area DA and intersect the signal line driving circuit XDR in the non-display area NDA. The lead lines LE1 are located between the control line SL3 and the driver IC chip IC1, and are electrically connected to the driver IC chip IC1 on the other hand. The lead lines LE2 extend in the second direction Y and intersect the first power line SL1, the second power line SL2, and the control line SL3. The lead lines LE2 connect the lead lines LE1 with the signal line driving circuit XDR.

The above-described control module CM supplies video signals to the signal line driving circuit XDR via the wiring substrate Fa, the pads p, the driver IC chip IC1, the lead lines LE1, the lead lines LE2, and the like, and the signal line driving circuit XDR supplies video signals to the signal lines VL.

The lead line LE3 is located between the control line SL3 and the driver IC chip IC1, and is electrically connected to the driver IC chip IC1 on one side and to the control line SL3 on the other side. The lead lines LE4 are located between the control line SL3 and the signal line driving circuit XDR, extend in the second direction Y, and intersect the first power line SL1 and the second power line SL2. The lead lines LE4 are electrically connected to the control line SL3 on one side and to the extension lines Sgr on the other side.

The above-described control module CM can fix the extension lines Sgr to a constant potential Vc via the wiring substrate Fa, the pads p, the driver IC chip IC1, the lead line LE3, the control line SL3, the lead lines LE4, and the like.

The control module CM controls the scanning line driving circuits YDR1 and YDR2 and the signal line driving circuit XDR together with the driver IC chip IC1. The control module CM receives a digital video signal and a synchronization signal supplied from the outside, and generates a vertical scanning control signal to control vertical scanning timing and a horizontal scanning control signal to control horizontal scanning timing, based on the synchronization signal.

Then, the control module CM, together with the driver IC chip IC1, supplies the vertical scanning control signal and the horizontal scanning control signal to the scanning line driving circuits YDR1 and YDR2 and the signal line driving circuit XDR, and supplies an analog video signal to the signal line driving circuit XDR in synchronization with the horizontal and vertical scanning timing.

The signal line driving circuit XDR selectively supplies analog video signals (Vsig) sequentially obtained in each horizontal scanning period under control of the horizontal scanning control signal, to the plurality of signal lines VL. The control module CM fixes the first power line SL1 to a high potential (Pvdd), the second power line SL2 to a low potential (Pvss), and the control line SL3 to a constant potential (Vc).

FIG. 3 is another circuit diagram showing the display device 1, illustrating the first electrode EL1, and the like.

As shown in FIG. 3, the array substrate 3 is equipped with a plurality of extension lines SLa and an extension line SL4 arranged above the basement 20. The extension line SL4 is located in the non-display area NDA and extend in the first direction X. The extension line SL4 and the first power line SL1 sandwich the display area DA in the second direction Y.

The plurality of extension lines SLa extend in the second direction Y and are spaced apart from each other in the first direction X, in the display area DA. Each of the extension lines SLa is electrically connected to the first power line SL1 on one side and electrically connected to the extension line SL4 on the other side.

The plurality of extension lines SLa and the extension line SL4 constitute the first electrode EL1. As described above, the first electrode EL1 is arranged above the basement 20, located in the display area DA, and electrically connected to the first power line SL1 in the non-display area NDA. The first electrode EL1 is electrically connected to the plurality of pixels PX.

In the present embodiment, the first power line SL1 is a high potential power line fixed to a high potential Pvdd. The high potential power supply of the above-described control module CM can fix the first power line SL1 to the high potential Pvdd via the wiring substrates F1 to F4, and the like. Therefore, the first electrode EL1 (extension line SLa, and the like) connected to the first power line SL1 is also fixed to the high potential Pvdd. The first power line SL1 is located between the display area DA and the plurality of pads p in the non-display area NDA. In the present embodiment, the first power line SL1 is located between the signal line driving circuit XDR and the second power line SL2.

The first electrode EL1 is arranged above the basement 20 and is electrically connected to the first power line SL1 in the non-display area NDA. The display area DA and the plurality of pads p sandwich the first power line SL1 in the second direction Y.

Figure 4:
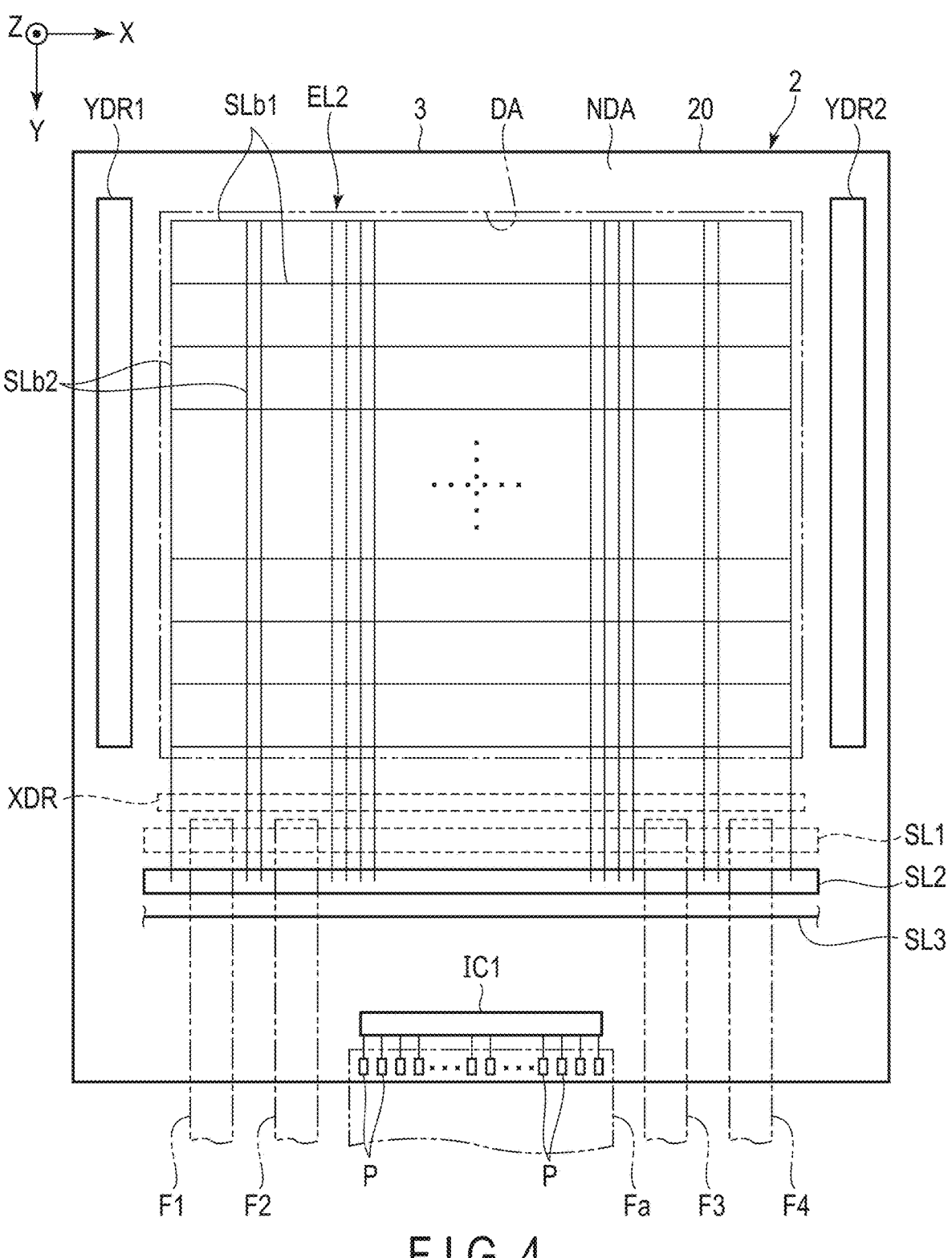

FIG. 4 is yet another circuit diagram showing the display device 1, illustrating the second electrode EL2, and the like.

As shown in FIG. 4, the array substrate 3 is equipped with a plurality of extension lines SLb1 and a plurality of extension lines SLb2 arranged above the basement 20. The plurality of extension lines SLb1 extend in the first direction X and are spaced apart in the second direction Y, in the display area DA. The plurality of extension lines SLb2 extend in the second direction Y, intersect the plurality of extension lines SLb1, and are spaced apart from each other in the first direction X, in the display area DA.

The plurality of extension lines SLb1 and the plurality of extension lines SLb2 are formed integrally and have a grating shape in the display area DA. Each of the extension lines SLb2 extends in the second direction Y, intersects the signal line driving circuit XDR and the first power line SL1, and is connected to the second power line SL2, in the non-display area NDA.

The plurality of extension lines SLb1 and the plurality of extension lines SLb2 constitute the second electrode EL2. As described above, the second electrode EL2 is arranged above the basement 20 and located in the display area DA, intersects the signal line driving circuit XDR and the first power line SL1 in the non-display area NDA, and is electrically connected to the second power line SL2 in the non-display area NDA. The second electrode EL2 is electrically connected to the plurality of pixels PX.

In the present embodiment, the second power line SL2 is a low-potential power line fixed to a low potential Pvss. The low potential Pvss is lower than the high potential Pvdd. The low-potential power supply of the above-described control module CM can fix the second power line SL2 to the low potential Pvss via the wiring substrates F1 to F4, and the like. Therefore, the second electrode EL2 (extension line SLb2, and the like) connected to the second power line SL2 is also fixed to the low potential Pvss. The second power line SL2 is located between the first power line SL1 and the plurality of pads p in the non-display area NDA. In the present embodiment, the second power line SL2 is located between the first power line SL1 and the control line SL3. The second power line SL2 is set to the potential (low potential Pvss) different from the potential of the first power line SL1 (high potential Pvdd).

The second electrode EL2 is arranged above the basement 20 and located in the display area DA, intersects the first power line SL1, and is electrically connected to the second power line SL2 in the non-display area NDA. The display area DA and the plurality of pads p sandwich the first power line SL1, the second power line SL2, and the like in the second direction Y.

Figure 5:
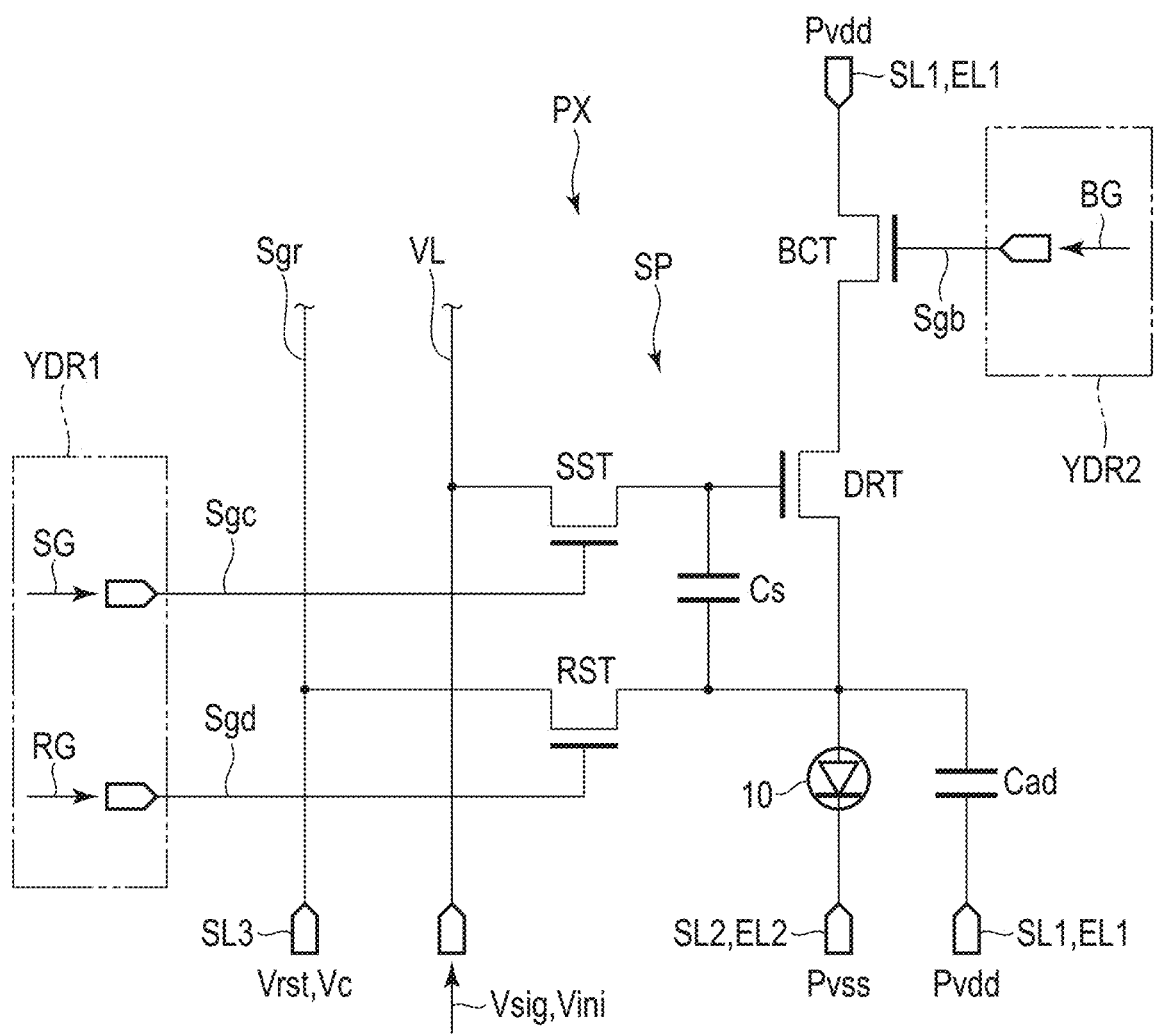

FIG. 5 is a circuit diagram showing the display panel 2 of the present embodiment, and equivalent circuit diagram showing the sub-pixel SP, and the like.

As shown in FIG. 5, each pixel PX includes a plurality of sub-pixels SP. Each of the sub-pixels SP includes a light emitting element 10 and a pixel circuit which supplies a drive current to the light emitting element 10. The light emitting element 10 is, for example, a self-luminous element, and is a micro-light emitting diode (hereinafter referred to as a micro-LED) in the present embodiment. The display device 1 of the present embodiment is a micro-LED display device.

The pixel circuit of each sub-pixel SP is a voltage signal type pixel circuit that controls the light emission of the light emitting element 10 in accordance with the video signal Vsig formed of a voltage signal, and includes a reset switch RST, a pixel switch SST, an output switch BCT, a drive transistor DRT, a storage capacitor Cs, and an auxiliary capacitor Cad. The storage capacitor Cs and the auxiliary capacitor Cad are capacitors. The auxiliary capacitor Cad is an element provided to adjust the amount of light emission current and may be unnecessary in some cases.

The first electrode EL1 (first power line SL1) is electrically connected to the plurality of pixels PX (plurality of sub-pixels SP). The second electrode EL2 (second power line SL2) is electrically connected to the plurality of pixels PX (plurality of sub-pixels SP).

The reset switch RST, the pixel switch SST, the output switch BCT, and the drive transistor DRT are composed of thin-film transistors (TFTs). In the present embodiment, the reset switch RST, the pixel switch SST, the output switch BCT, and the drive transistor DRT are composed of TFTs of the same conductivity type, for example, N-channel type. Incidentally, one or more of the reset switch RST, the pixel switch SST, the output switch BCT, and the drive transistor DRT may be constituted by P-channel TFTs. In this case, the N-channel TFT and the P-channel TFT may be formed at the same time. The reset switch RST, the pixel switch SST, and the output switch BCT need only to function as switches, and do not need to be composed of TFTs.

In the display device 1 according to the present embodiment, all the TFTs that constitute the respective drive transistors DRT and the switches are top-gate thin-film transistors formed in the same processes with the same layer structure, using polycrystalline silicon for the semiconductor layer. Incidentally, a semiconductor other than polycrystalline silicon, such as amorphous silicon or an oxide semiconductor may be used for the semiconductor layer.

Each of the reset switch RST, the pixel switch SST, the output switch BCT, and the drive transistor DRT includes a first terminal, a second terminal, and a control terminal. In the present embodiment, the first terminal is referred to as a source electrode, the second terminal is referred to as a drain electrode, and the control terminal is referred to as a gate electrode.

In the pixel circuit of the sub-pixel SP, the drive transistor DRT and the output switch BCT are connected in series with the light emitting element 10 at positions between the first power line SL1 and the second power line SL2. The first power line SL1 (high potential Pvdd) is set to a potential of, for example, 10V and the second power line SL2 (low potential Pvss) is set to a potential of, for example, 1.5V.

In the output switch BCT, a drain electrode is connected to the first power line SL1, a source electrode is connected to a drain electrode of the drive transistor DRT, and a gate electrode is connected to the first scanning line Sgb. As a result, the output switch BCT is controlled to be on (conductive state) or off (non-conductive state) by a control signal BG supplied to the first scanning line Sgb. The output switch BCT controls the light emission time of the light emitting element 10 in response to the control signal BG.

In the drive transistor DRT, a drain electrode is connected to the source electrode of the output switch BCT, and a source electrode is connected to one of electrodes (in this example, an anode) of the light emitting element 10. The other electrode (in this example, a cathode) of the light emitting element 10 is connected to the second power line SL2. The drive transistor DRT outputs a drive current having a current amount corresponding to the video signal Vsig to the light emitting element 10.

In the pixel switch SST, a source electrode is connected to the signal line VL, a drain electrode is connected to the gate electrode of the drive transistor DRT, and a gate electrode is connected to the second scanning line Sgc which functions as a gate line for signal write control. The pixel switch SST is controlled to be on and off by a control signal SG supplied from the second scanning line Sgc. Then, the pixel switch SST controls connection and disconnection between the pixel circuit and the signal line VL and takes a video signal Vsig and an initialization signal Vini from the signal line VL into the pixel circuit, in response to the control signal SG.

The reset switch RST is connected between the source electrode of the drive transistor DRT and the extension lines Sgr. The gate electrode of the reset switch RST is connected to the third scanning line Sgd that functions as a reset control gate line. As described above, the extension line Sgr is connected to the control line SL3 (constant potential power supply of the above control module CM) and fixed to the constant potential Vc (reset potential).

A reset signal Vrst of the constant potential Vc is supplied to the extension line Sgr. The reset switch RST is switched to a conductive state (on) or a non-conductive state (off) in response to the control signal RG supplied through the third scanning line Sgd. The reset switch RST is switched to be the on state such that the potential of the source electrode of the drive transistor DRT can be reset to the constant potential Vc.

The storage capacitor Cs is connected between the gate electrode and the source electrode of the drive transistor DRT. The auxiliary capacitor Cad is connected between the source electrode of the drive transistor DRT and the first power line SL1 serving as a constant potential line.

The scanning line driving circuits YDR1 and YDR2 include shift registers, output buffers, and the like, which are not shown in the drawing, sequentially transfer the above start pulse signal STV to the shift register of the next stage and supply three control signals, i.e., control signals BG, SG, and RG to the sub-pixels SP in each row via the output buffers. As a result, the first scanning line Sgb, the second scanning line Sgc, and the third scanning line Sgd are driven by the control signals BG, SG, and RG, respectively.

Incidentally, the circuit configuration of the sub-pixel SP described with reference to FIG. 5 is an example, and the circuit configuration of the sub-pixel SP may be the other configuration as long as the circuit configuration includes at least the drive transistor DRT and the light emitting element 10. For example, several elements in the circuit configuration of the sub-pixel SP described with reference to FIG. 5 may be omitted or other elements may be added.

Next, the structures of the drive transistor DRT, the pixel electrode PE, the light emitting element 10, the common electrode CE, and the like will be described with reference to FIG. 6. FIG. 6 is a partially cross-sectional view showing the display area DA of the display panel 2. Incidentally, in FIG. 6, the display panel 2 is drawn such that the display surface, i.e., the light emission surface faces upward and the back surface faces downward.

As shown in FIG. 6, the display panel 2 comprises the basement 20, insulating layers 21, 22, 23, 24, 25, and 26 provided on the basement 20, and the plurality of pixels PX. The basement 20 is located in the display area DA and the non-display area NDA located outside the display area DA. The plurality of pixels PX are arranged above the basement 20 and located in the display area DA, and include sub-pixels SP of a plurality of colors.

A glass substrate of quartz, alkali-free glass, and the like or a resin substrate of polyimide or the like can be mainly used as the basement 20. The material of the basement 20 may be a material withstanding a processing temperature during manufacturing the TFT. When the basement 20 is a flexible resin substrate, the display device 1 can be constituted as a sheet display. The resin substrate may be formed of not polyimide, but the other resin material. Incidentally, when polyimide or the like is used for the basement 20, the basement 20 may be referred to as an organic insulating layer or a resin layer, more appropriately, in some cases.

The insulating layer 21 is provided on the basement 20. Various TFTs are formed on the insulating layer 21. In the display area DA, the drive transistor DRT or the like is formed on the insulating layer 21. The TFT such as the drive transistor DRT comprises a semiconductor layer SC, a gate electrode GE, a first electrode E1, and a second electrode E2.

The semiconductor layer SC is arranged on the insulating layer 21. The insulating layer 22 is provided on the insulating layer 21 and the semiconductor layer SC. The gate electrode GE is arranged on the insulating layer 22 and is opposed to a channel region of the semiconductor layer SC. In the present embodiment, the drive transistor DRT is a double-gate TFT, comprising two gate electrodes GE. The insulating layer 23 is provided on the insulating layer 22 and the gate electrode GE. The first electrode E1 and the second electrode E2 are arranged on the insulating layer 23. The first electrode E1 and the second electrode E2 are electrically connected to the corresponding semiconductor layer SC through contact holes formed in the insulating layer 22 and the insulating layer 23. In the present embodiment, an extension line SLa is further provided on the insulating layer 23.

The insulating layer 24 is provided on the insulating layer 23, the first electrode E1, the second electrode E2, and the extension line SLa. The insulating layer 24 covers a plurality of TFTs such as a plurality of drive transistors DRT. A plurality of contact holes h1 and h2 are formed in the insulating layer 24. The contact hole h1 exposes an upper surface of the first electrode E1. The contact hole h2 exposes an upper surface of the extension line SLa.

A conductive layer CL1 is provided on the insulating layer 24. The conductive layer CL1 is in contact with the extension line SLa through the contact hole h2 and is electrically connected to the extension line SLa. Incidentally, the conductive layer CL1 includes an opening surrounding the contact hole h1.

The insulating layer 25 is provided on the insulating layer 24 and the conductive layer CL1. The insulating layer 25 includes a contact hole h3 surrounded by the contact hole h1, and the contact hole h3 exposes an upper surface of the first electrode E1 together with the contact hole h1. The conductive layer CL2 is arranged on the insulating layer 25. The conductive layer CL2 is in contact with the first electrode E1 through the contact hole h3 formed in the insulating layer 25 and is electrically connected to the first electrode E1. In the present embodiment, the conductive layer CL1 and the conductive layer CL2 are opposed to each other across the insulating layer 25 and form the above auxiliary capacitor Cad together with the insulating layer 25.

In the present embodiment, the extension line SLb2 (second electrode EL2) is further provided on the insulating layer 25. The insulating layer 26 is provided on the insulating layer 25, the conductive layer CL2, and the extension line SLb2. Contact holes h4 and h5 are formed in the insulating layer 26, the contact hole h4 exposes an upper surface of the conductive layer CL2, and the contact hole h5 exposes an upper surface of the extension line SLb2 (second electrode EL2).

The pixel electrode PE is arranged on the insulating layer 26. The pixel electrode PE is in contact with the conductive layer CL2 through the contact hole h4 formed in the insulating layer 26 and is electrically connected to the conductive layer CL2. The pixel electrode PE is electrically connected to the first electrode E1 of the drive transistor DRT via the conductive layer CL2. A signal whose current value is controlled is supplied from the drive transistor DRT to the pixel electrode PE.

In the present embodiment, the array substrate 3 includes a contact electrode CON. The contact electrode CON is provided on the insulating layer 26 and is located at an insulation distance from the pixel electrode PE. The contact electrode CON is in contact with the extension line SLb2 (second electrode EL2) through the contact hole h5 formed in the insulating layer 26 and is electrically connected to the extension line SLb2.

In this example, the insulating layers 21, 22, 23, 24, 25, and 26 are formed of an inorganic insulating material or an organic insulating material. In the present embodiment, the insulating layers 21, 22, 23, and 25 are formed of, for example, silicon oxide ($SiO_2$) or silicon nitride (SiN) as the inorganic insulating material.

The insulating layers 24 and 26 are formed of a resin material such as photosensitive acrylic resin as the organic insulating material. Each of the insulating layers 24 and 26 has a flat surface on a side opposed to the light emitting element 10, and functions as a planarizing layer.

The semiconductor layer SC is formed of low temperature polycrystalline silicon as polycrystalline silicon. However, the semiconductor layer SC may be formed of a semiconductor other than polycrystalline silicon, such as amorphous silicon or an oxide semiconductor. The gate electrode GE is formed of a metal as a conductive material. For example, the gate electrode GE is formed of molybdenum/tungsten (MoW). Incidentally, wiring lines and electrodes formed on the insulating layer 22, such as the gate electrode GE, are often referred to as 1st metal.

The first electrode E1, the second electrode E2, and the extension line SLa are located in the same layer and are formed of a metal as the same conductive material. For example, each of the first electrode E1, the second electrode E2, and the extension line SLa adopts a three-layer laminated structure (Ti-based/Al-based/Ti-based), and includes a first layer formed of a metal material containing titanium (Ti) as a main component, such as Ti or an alloy containing Ti, a second layer formed of a metal material containing aluminum (Al) as a main component, such as Al or an alloy containing Al, and a third layer formed of a metal material containing Ti as a main component, such as Ti or an alloy containing Ti. The second layer is located on the first layer, and the third layer is located on the second layer. The first electrode E1, and the like are formed by so-called TAT. Incidentally, the wiring lines and electrodes formed on the insulating layer 23, such as the extension lines SLa, may be referred to as 2nd metal.

A switch such as the drive transistor DRT is provided above the basement 20 and is covered with the insulating layer 24. The top-gate TFT has been described as the example, but the TFT may be a bottom-gate TFT.

The conductive layer CL1 is formed of a transparent conductive material such as indium tin oxide (ITO) or indium zinc oxide (IZO).

The conductive layer CL2 and the extension line SLb2 (second electrode EL2) are formed of a metal as the conductive material. For example, the conductive layer CL2 and the extension line SLb2 (second electrode EL2) have a two-layer laminated structure, including a first layer formed of metal materials containing Ti as their main component, such as Ti or an alloy containing Ti, and a second layer formed of metal materials containing Al as their main component, such as Al or an alloy containing Al. The second layer is located on the first layer. Incidentally, the wiring lines and electrodes formed on the insulating layer 25, such as the extension lines SLb2, may be referred to as 3rd metal.

The pixel electrode PE and the contact electrode CON are formed of a metal as their conductive material. For example, the pixel electrode PE and he contact electrode CON have a two-layer laminated structure, including a first layer formed of metal materials containing Ti as their main component, such as Ti or an alloy containing Ti, and a second layer formed of metal materials containing Al as their main component, such as Al or an alloy containing Al. In the pixel electrode PE and the contact electrode CON, the second layer formed of Al or an Al alloy is an uppermost layer. For example, the uppermost layer of the contact electrode CON is located on a side opposed to the common electrode CE. The pixel electrode PE and the contact electrode CON are desirably located in the same layer and formed of a metal as the same conductive material. When the pixel electrode PE and the contact electrode CON are formed of a metal, the electrode formed on the insulating layer 26, such as the pixel electrode PE, may be referred to as 4th metal.

Each of the conductive layer CL2, the extension line SLb2 (second electrode EL2), the pixel electrode PE, and the contact electrode CON may have a single conductive layer, a three-layer laminated structure, or a two-layer laminated structure.

In the three-layer laminated structure, each of the conductive layer CL2, the extension line SLb2 (second electrode EL2), the pixel electrode PE, and the contact electrode CON is not limited to the Ti-based/Al-based/Ti-based structure, but may be the Mo-based/Al-based/Mo-based structure. In the Mo-based/Al-based/Mo-based structure, for example, the pixel electrode PE includes a first layer formed of a metal material containing molybdenum (Mo) as its main component such Mo or an alloy containing Mo, a second layer formed of a metal material containing Al as its main component such as Al or an alloy containing Al, and a third layer formed of a metal material containing Mo as its main component such as Mo or an alloy containing Mo. In this case, the pixel electrode PE and the like are formed by so-called MAM.

In the two-layer laminated structure, for example, the pixel electrode PE may include a first layer formed of a metal material containing Mo as its main component such as Mo or an alloy containing Mo, and a second layer formed of a metal material containing Al as its main component such as Al or an alloy containing Al. Incidentally, the conductive layer CL2 and the pixel electrode PE may be formed of a transparent conductive material.

As described above, the array substrate 3 of the display panel 2 has a laminated structure from the basement 20 to the pixel electrode PE and the contact electrode CON.

The display panel 2 includes a connection layer LA1 and a connection layer LA2. The connection layer LA1 is arranged on the pixel electrode PE and electrically connected to the pixel electrode PE. The connection layer LA1 does not overlap with the contact hole h4 in planar view. The connection layer LA2 is arranged on the contact electrode CON and electrically connected to the contact electrode CON. The connection layer LA2 does not overlap with the contact hole h5 in planar view. The connection layer LA1 is in contact with the uppermost layer of the pixel electrode PE, and the connection layer LA2 is in contact with the uppermost layer of the contact electrode CON. In the present embodiment, each of the connection layers LA1 and LA2 is formed of solder.

The light emitting element 10 is mounted above the pixel electrode PE in the display area DA. More specifically, the light emitting element 10 is mounted on the connection layer LA1. The light emitting element 10 includes an anode AN serving as a first polar electrode, a cathode CA serving as a second polar electrode, and a light emitting layer LI which emits light. The plurality of light emitting elements 10 include light emitting elements having a first light emission color, light emitting elements having a second light emission color, and light emitting element having a third light emission color. In the present embodiment, the first color is red (R), the second color is green (G), and the third color is blue (B).

In each of the light emitting elements 10, the anode AN is located on the surface of the side opposed to one corresponding pixel electrode PE among the plurality of pixel electrodes PE, and is electrically connected to the pixel electrode PE. In the present embodiment, the anode AN is located on the connection layer LA1 and is in contact with the connection layer LA1. In each of the light emitting elements 10, the cathode CA is located on the surface of the side opposite to the surface on which the anode AN is located. In each of the light emitting elements 10, the light emitting layer LI is located between the anode AN and the cathode CA.

The display panel 2 includes a resin layer 31 and a common electrode CE. A resin layer 31 is provided on the insulating layer 26, the pixel electrode PE, the contact electrode CON, the connection layer LA1, the connection layer LA2, and the light emitting element 10. The resin layer 31 is filled in gaps between the plurality of light emitting elements 10. The resin layer 31 has a flat surface on the side opposite to the side opposed to the insulating layer 26. For this reason, the resin layer 31 is a planarizing layer. The resin layer 31 exposes the surfaces of the cathodes CA of the light emitting elements 10.

Incidentally, the resin layer 31 may have a thickness that does not reach the cathodes CA of the light emitting elements 10. The unevenness caused by mounting of the light emitting elements 10 partially remains on the surface where the common electrode CE is formed, but may continuously cover without forming a stepped part in the material for forming the common electrode CE.

The common electrode CE is located in at least the display area DA and arranged on the resin layer 31 and the plurality of light emitting elements 10 to cover the plurality of light emitting elements 10. The common electrode CE is in contact with the plurality of cathodes CA and is electrically connected to the plurality of cathodes CA. The common electrode CE is shared by the plurality of sub-pixels SP.

The common electrode CE needs to be formed as a transparent electrode to extract the light emitted from the light emitting elements 10, and is formed of, for example, ITO as a transparent conductive material.

The common electrode CE is electrically connected to the contact electrodes CON of the plurality of pixels PX through a plurality of contact holes h6 formed in the resin layer 31. In the present embodiment, the common electrode CE is in contact with the connection layer LA2 of the plurality of pixels PX through the plurality of contact holes h6. Since the common electrode CE is in contact with not the contact electrode CON, but the connection layer LA2, ohmic contact can be formed between the common electrode CE and the connection layer LA2.

As described above, the display panel 2 has a structure from the basement 20 to the common electrode CE. For example, the display device 1 using the light emitting elements 10 according to the present embodiment as the display elements is configured as described above. A cover member such as a cover glass, an optical layer such as a polarizer, a touch panel board or the like may be provided on the common electrode CE as needed.

Figure 7:
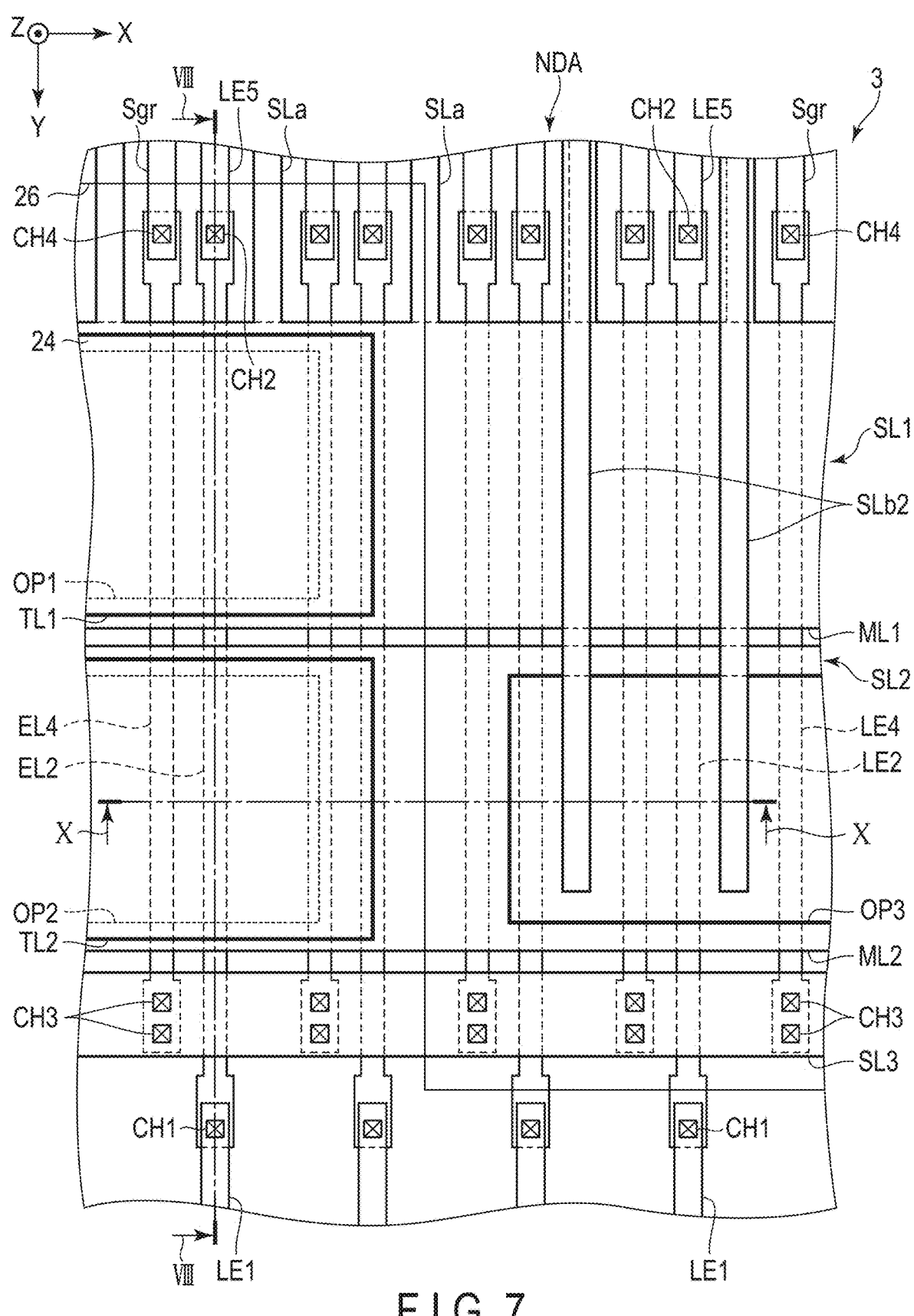
FIG. 7 is a plan view showing a non-display area on the display panel.

FIG. 7 is a plan view showing the non-display area NDA of the array substrate 3 of the display panel 2.

As shown in FIG. 7, the array substrate 3 includes a plurality of peripheral lines arranged above the basement 20 and located in the non-display area NDA. The plurality of peripheral lines include the first power line SL1, the second power line SL2, the control line SL3, the lead line LE1, the lead line LE2, the lead line LE3, the lead line LE4, the lead line LE5, an end of the extension line Sgr, an end of the extension line SLb2, an end of the extension line SLa, and the like.

Each of the first power line SL1, the second power line SL2, and the control line SL3 extends in the first direction X as described above. In the present embodiment, the first power line SL1 and the plurality of extension lines SLa are integrally formed of the same material. Each of the extension lines SLa is formed continuously from the first power line SL1.

The lead line LE2 serving as the first connection line intersects the first power line SL1, the second power line SL2, and the control line SL3.

The lead line LE1 serving as the second connection line overlaps with the lead line LE2 in planar view. On one hand, the lead line LE1 is in contact with the lead line LE2 through a contact hole CH1 formed in the insulating layer 23 and is electrically connected to the lead line LE2. On the other hand, the lead line LE1 is electrically connected to the driver IC chip IC1.

The lead line LE5 serving as the third connection line overlaps with the lead line LE2 in planar view. On one hand, the lead line LE5 is in contact with the lead line LE2 through a contact hole CH2 formed in the insulating layer 23 and is electrically connected to the lead line LE2. On the other hand, the lead line LE5 is electrically connected to the signal line driving circuit XDR and is electrically connected to at least one signal line VL among the plurality of signal lines VL via the signal line driving circuit XDR.

The lead line LE4 extends in the second direction Y and intersects the first power line SL1 and the second power line SL2.

The control line SL3 overlaps with the plurality of lead lines LE4 in planar view. When the control line SL3 and one lead line LE4 are focused, the control line SL3 is in contact with the lead line LE4 through the contact hole CH3 formed in the insulating layer 23 and is electrically connected to the lead line LE4.

The extension line Sgr overlaps with the lead line LE4 in planar view. The extension line Sgr is in contact with the lead line LE4 through the contact hole CH4 formed in the insulating layer 23 and is electrically connected to the lead line LE4.

The first power line SL1 includes a metal line ML1 and a first transparent conductive layer TL1. The metal line ML1 extends in the first direction X. The first transparent conductive layer TL1 overlaps with the metal line ML1 in planar view. In the present embodiment, the first power line SL1 includes a plurality of first transparent conductive layers TL1. The plurality of first transparent conductive layers TL1 and the wiring substrates F1, F2, F3, and F4 correspond in one-on-one relationship.

The second power line SL2 includes a metal line ML2 and a second transparent conductive layer TL2. The metal line ML2 extends in the first direction X. The second transparent conductive layer TL2 overlaps with the metal line ML2 in planar view. In the present embodiment, the second power line SL2 includes a plurality of second transparent conductive layers TL2. The plurality of second transparent conductive layers TL2 and the wiring substrates F1, F2, F3, and F4 correspond in one-on-one relationship.

The insulating layer 24 includes a first opening OP1, a second opening OP2, and a third opening OP3. In the present embodiment, the insulating layer 24 includes a plurality of first openings OP1, a plurality of second openings OP2, and a plurality of third openings OP3.

The plurality of first openings OP1 and the plurality of first transparent conductive layers TL1 correspond in one-on-one relationship. The first opening OP1 is formed in an area overlapping with the corresponding first transparent conductive layer TL1 in planar view, and exposes the corresponding first transparent conductive layer TL1 to the outside of the display panel 2.

The plurality of second openings OP2 and the plurality of second transparent conductive layers TL2 correspond in one-on-one relationship. The second opening OP2 is formed in an area overlapping with the corresponding second transparent conductive layer TL2 in planar view, and exposes the corresponding second transparent conductive layer TL2 to the outside of the display panel 2.

The second opening OP2 and the third opening OP3 are formed in the insulating layer 24 at a distance in the first direction X. Each of the third openings OP3 is formed in an area overlapping with the second power line SL2 in planar view. The insulating layer 24 exposes a predetermined area of the second power line SL2 at the third opening OP3.

The extension lines SLb2 overlap with the second power line SL2 and the third opening OP3 in planar view. The extension lines SLb2 are in contact with the second power line SL2 through the third opening OP3 and are electrically connected to the second power line SL2.

Figure 8:
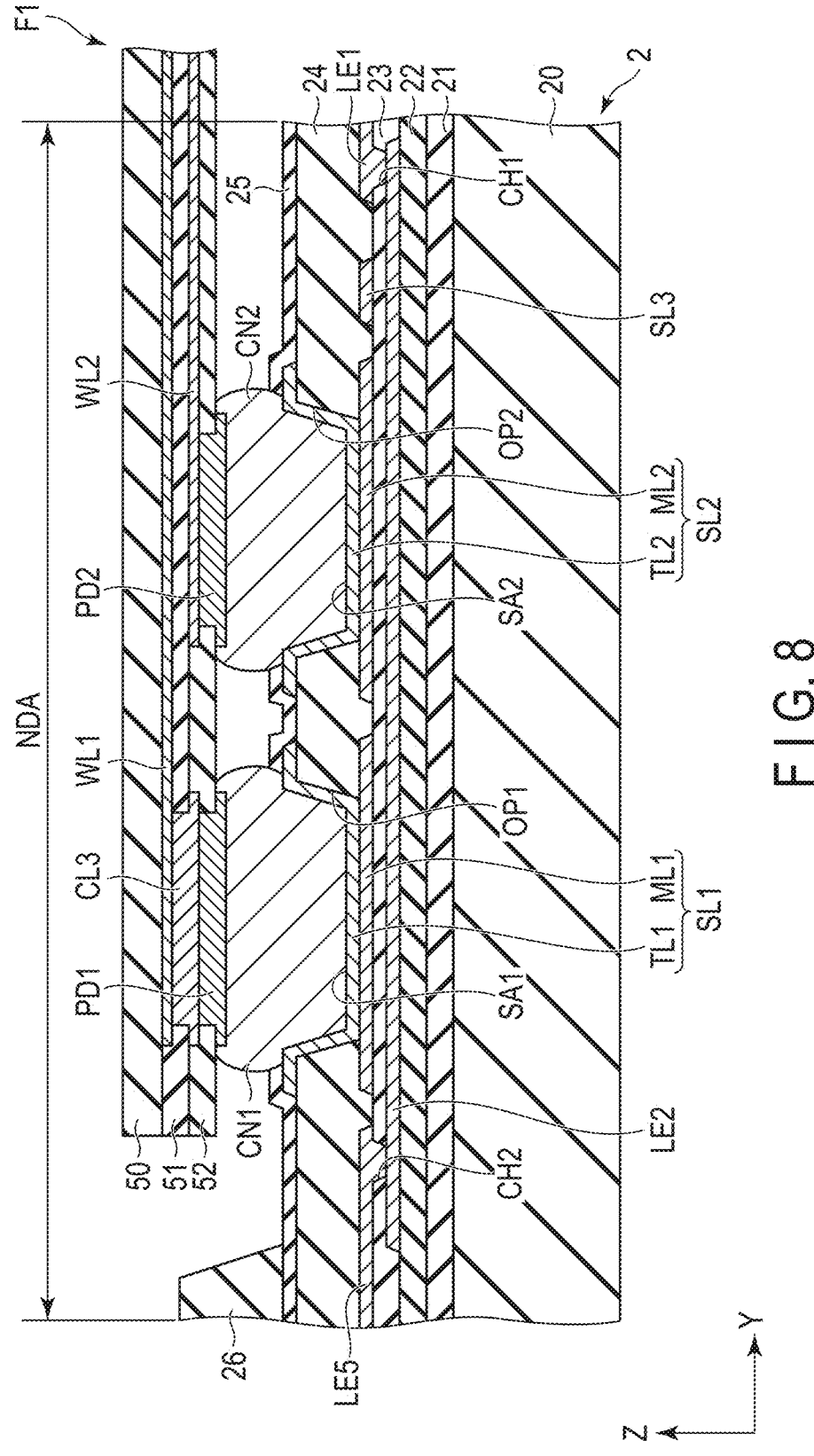
FIG. 8 is a cross-sectional view showing the display panel shown in FIG. 7 along line VIII-VIII, illustrating a wiring substrate and a conductive material together.

FIG. 8 is a cross-sectional view showing the display panel 2 of FIG. 7, along line VIII-VIII, together with the wiring substrate F1 and conductive materials (CN1 and CN2).

As shown in FIG. 8, the lead line LE2 is provided on the insulating layer 22. The lead line LE2 is the 1st metal.

The metal line ML1, the metal line ML2, the control line SL3, the lead line LE1, and the lead line LE5 are the 2nd metals and are provided on the insulating layer 23. Incidentally, the lead line LE2 (first connection line) is located between the basement 20 and the first power line SL1, and between the basement 20 and the second power line SL2.

The first transparent conductive layer TL1 is provided on the insulating layer 24 and is in contact with the metal line ML1 through the first opening OP1. The first power line SL1 is located above the basement 20 and includes a first connection surface SA1. In the present embodiment, the first transparent conductive layer TL1 includes the first connection surface SA1.

The second transparent conductive layer TL2 is provided on the insulating layer 24 and is in contact with the metal line ML2 through the second aperture OP2. The second power line SL2 is arranged above the basement 20 and includes the second connection surface SA2. In the present embodiment, the second transparent conductive layer TL2 includes the second connection surface SA2.

The wiring substrate F1 comprises an insulating basement 50, an insulating layer 51, an insulating layer 52, a wiring line WL1, a wiring line WL2, a conductive layer CL3, a pad PD1, a pad PD2, and the like. The wiring line WL1 is provided between the basement 50 and the insulating layer 51. The wiring line WL2 and the conductive layer CL3 are located between the insulating layer 51 and the insulating layer 52. The conductive layer CL3 is in contact with the wiring line WL1 through a contact hole formed in the insulating layer 51 and is electrically connected to the wiring line WL1.

The pad PD1 is in contact with the conductive layer CL3 through a contact hole formed in the insulating layer 52 and is electrically connected to the conductive layer CL3. The pad PD2 is in contact with the wiring line WL2 through a contact hole formed in the insulating layer 52 and is electrically connected to the wiring line WL2. Of the wiring substrate F1, the pad PD1 is opposed to the first connection surface SA1 and the pad PD2 is opposed to the second connection surface SA2.

The first conductive material CN1 is located between the first connection surface SA1 and the pad PD1 of the wiring substrate F1 and connects the first power line SL1 with the wiring substrate F1. The second conductive material CN2 is located between the second connection surface SA2 and the pad PD2 of the wiring substrate F1 and connects the second power line SL2 with the wiring substrate F1. The first conductive material CN1 and the second conductive material CN2 are, for example, anisotropic conductive films (ACF).

A thermo-compression method using ACF is used to connect the wiring substrate F1 with the display panel 2 (array substrate 3). This method ensures the electric connection between the first power line SL1 of the array substrate 3 and the pad PD1 of the wiring substrate F1, and also ensures the electric connection between the second power line SL2 of the array substrate 3 and the pad PD2 of the wiring substrate F1.

Incidentally, the connection between the wiring substrate F2 and display panel 2, the connection between the wiring substrate F3 and the display panel 2, and the connection between the wiring substrate F4 and the display panel 2 are the same as the connection between the wiring substrate F1 and the display panel 2 (array substrate 3) described with reference to FIG. 8.

For example, the connection between the wiring substrate F2 and the display panel 2 will be focused. The first power line SL1 further includes the other first connection surface that is separated in the first direction X from the first connection surface SA1 opposed to the wiring substrate F1 and that is opposed to the wiring substrate F2. The second power line SL2 further includes the other second connection surface that is separated in the first direction X from the second connection surface SA2 opposed to the wiring substrate F1 and that is opposed to the wiring substrate F2. The other first conductive material is located between the other first connection surface and the wiring substrate F2 and connects the first power line SL1 with the wiring substrate F2. The other second conductive material is located between the other second connection surface and the wiring substrate F2 and connects the second power line SL2 with the wiring substrate F2.

Figure 9:
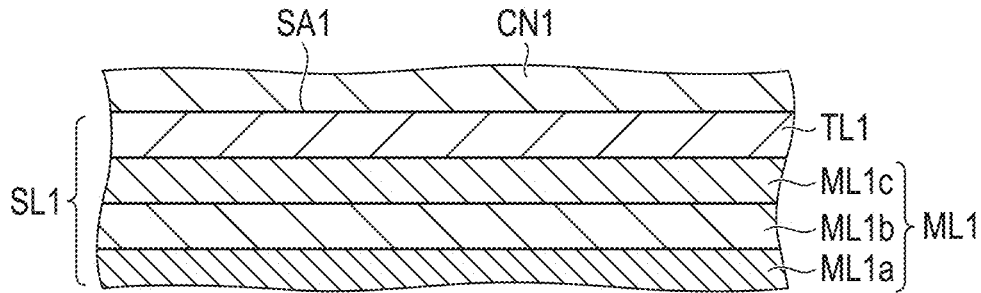

FIG. 9 is a partially cross-sectional view showing the display panel 2 shown in FIG. 8, illustrating the first power line SL1, and the like.

As shown in FIG. 9, the metal line ML1 is the 2nd metal and is located in the same layer as the metal line ML2, the control line SL3, the lead line LE1, the lead line LE5, the extension line Sgr, the signal line VL, the first electrode E1, the second electrode E2, the extension line SLa, and the like and is formed of a metal as the same conductive material.

The metal line ML1 includes a first metal line ML1*a*, a second metal line ML1*b* laminated on the first metal line ML1*a*, and a third metal line ML1*c* laminated on the second metal line ML1*b*. In the present embodiment, the first metal line MLla is formed of a metal material containing Ti as its main component, the second metal line ML1*b* is formed of a metal material containing Al as its main component, and the third metal line ML1*c* is formed of a metal material containing Ti as its main component. The first transparent conductive layer TL1 is formed on the third metal line ML1*c* and includes the first connection surface SA1.

Incidentally, the metal line ML1, and the like are not limited to TAT, but may be formed by MAM. FIG. 10 is a cross-sectional view showing the display panel 2 shown in FIG. 7 along line X-X. As shown in FIG. 10, each of the lead line LE2 and the lead line LE4 is the 1st metal, and is provided on the insulating layer 22. The metal line ML2 is the 2nd metal and is provided on the insulating layer 23. The second transparent conductive layer TL2 is provided on the metal line ML2 and the insulating layer 24, and forms the second power line SL2 together with the metal line ML2.

The insulating layer 25 does not cover the area opposed to the second connection surface SA2 of the second transparent conductive layer TL2 or the area opposed to the extension line SLb2. The extension line SLb2 is the 3rd metal and is provided on the metal line ML2 of the second power line SL2, and is in contact with the metal line ML2 and electrically connected to the metal line ML2. The second power line SL2 is covered with the insulating layer 26.

FIG. 11 is a plan view showing a part of the display device 1, illustrating the first power line SL1, the second power line SL2, the control line SL3, the second electrode EL2, the wiring substrate F2, and the plurality of conductive materials (CN1 and CN2). As shown in FIG. 11, the wiring substrate F2 overlaps with the first connection surface SA1 of the first power line SL1 and the second connection surface SA2 of the second power line SL2. In the present embodiment, the first connection surface SA1 and the second connection surface SA2 are arranged in the second direction Y. Each of the first connection surface SA1 and the second connection surface SA2 extends in the first direction X.

The first conductive material CN1 is located between first connection surface SA1 and the wiring substrate F2 and connects the first power line SL1 with the wiring substrate F2. The second conductive material CN2 is located between the second connection surface SA2 and the wiring substrate F2 and connects the second power line SL2 with the wiring substrate F2.

FIG. 12 is a plan view showing the wiring substrate F2 in FIG. 11, illustrating the plurality of wiring lines WL1 and WL2 and the plurality of pads PD1, PD2, PD3, and PD4. As shown in FIG. 12, the wiring substrate F2 includes the plurality of wiring lines WL1, the plurality of wiring lines WL2, the plurality of pads PD1, the plurality of pads PD2, the plurality of pads PD3, and the plurality of pads PD4. The pad PD1 is electrically connected to one end of the wiring line WL1, and the pad PD3 is electrically connected to the other end of the wiring line WL1. In addition, the pad PD2 is electrically connected to one end of the wiring line WL2, and the pad PD4 is electrically connected to the other end of the wiring line WL2.

To make the plurality of pads PD1 of the wiring substrate F2 opposed to the first connection surface SA1, the plurality of pads PD1 are arranged in the first direction X. To make the plurality of pads PD2 of the wiring substrate F2 opposed to the second connection surface SA2, the plurality of pads PD2 are arranged in the first direction X. The plurality of pads PD3 and PD4 of the wiring substrate F2 are connected to the control module CM.

According to the display device 1 of the first embodiment configured as described above, the display device 1 comprises the display panel 2, the wiring substrate F1, and the first conductive material CN1. The display panel 2 includes the basement 20, the plurality of pixels PX, the plurality of pads p, and the first power line SL1. The basement 20 is located in the display area DA and the non-display area NDA. The plurality of pixels PX are arranged above the basement 20 and are located in the display area DA. The plurality of pads p are arranged above the basement 20 and are located in the non-display area NDA. The first power line SL1 is arranged above the basement 20 and located between the display area DA and the plurality of pads p in the non-display area NDA, and includes the first connection surface SA1.

The wiring substrate F1 is opposed to the first connection surface SA1. The first conductive material CN1 is located between the first connection surface SA1 and the wiring substrate F1 and connects the first power line SL1 with the wiring substrate F1. The first power line SL1 of the display panel 2 is made to comprise the function of the pad to electrically connect with the wiring substrate F1. Therefore, power can be supplied to the first power line SL1 without the pad p, and the potential of the first power line SL1 can be fixed.

The first power line SL1 has a plurality of first connection surfaces SA1 each functioning as a pad. Multiple points can be used to supply power to the first power line SL1 by using the plurality of wiring substrates F1, F2, F3, and F4.

In addition, when the current is made to flow from the control module CM to the first power line SL1, the current is distributed to the plurality of wiring substrates F1, F2, F3, and F4. For this reason, ohmic drop (IR drop) can be improved.

Based on the above, the potential of the first power line SL1 is desirably fixed to the high potential Pvdd. Similarly, the potential of the second power line SL2 is desirably fixed to the low potential Pvss. Moreover, each of the potentials of the first electrode EL1 and the second electrode EL2 can be desirably fixed. As described above, the display device 1 capable of suppressing the degradation in display characteristics can be obtained.

Modified Example 1 of the Embodiment

Figure 13:
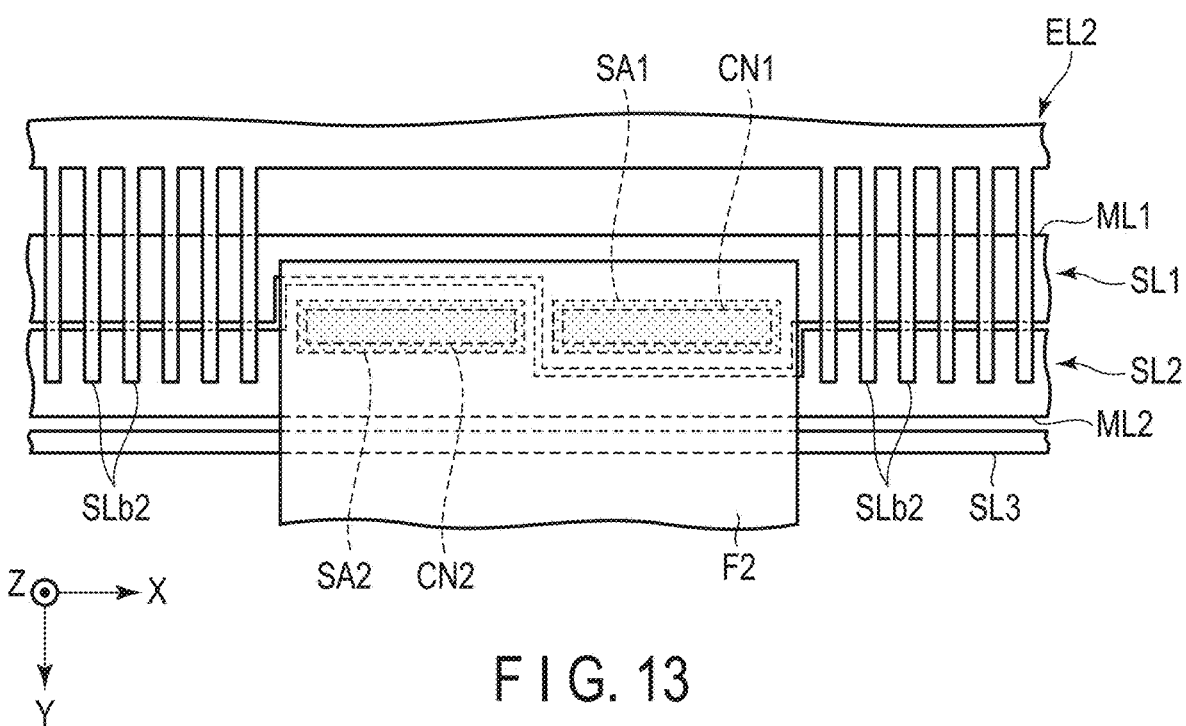
FIG. 13 is a plan view showing parts of the display device according to modified example 1 of the embodiment, illustrating the first power line, the second power line, a control line, the second electrode, the wiring substrate, and a plurality of conductive materials.

Next, the display device 1 according to modified example 1 of the above-described embodiment will be described. The display device 1 is configured in the same manner as the above-described embodiment except for constituent elements to be described in modified example 1. FIG. 13 is a plan view showing a part of the display device 1 according to modified example 1, illustrating the first power line SL1, the second power line SL2, the control line SL3, the second electrode EL2, the wiring substrate F2, and the plurality of conductive materials (CN1 and CN2).

As shown in FIG. 13, each of the first connection surface SA1 and the second connection surface SA2 extends in the first direction X. In the present embodiment, the first connection surface SA1 and the second connection surface SA2 are arranged in the first direction X. Since the first connection surface SA1 and the second connection surface SA2 are arranged in the first direction X, the shape of each of the metal line ML1 and the metal line ML2 is different from that in the above-described embodiment.

When compared with an area of the metal line ML1 which overlaps with the extension line SLb2, an area of the metal line ML1 which overlaps with the first connection surface SA1 protrudes toward the metal line ML2 side, and the area of the metal line ML1 which is opposed to the second connection surface SA2 in the second direction Y is recessed toward the display area DA side. When compared with an area of the metal line ML2 which overlaps with the extension line SLb2, an area of the metal line ML2 which overlaps with the second connection surface SA2 protrudes toward the metal line ML1 side, and the area of the metal line ML2 which is opposed to the first connection surface SA1 in the second direction Y is recessed toward the control line SL3 side.

Figure 14:
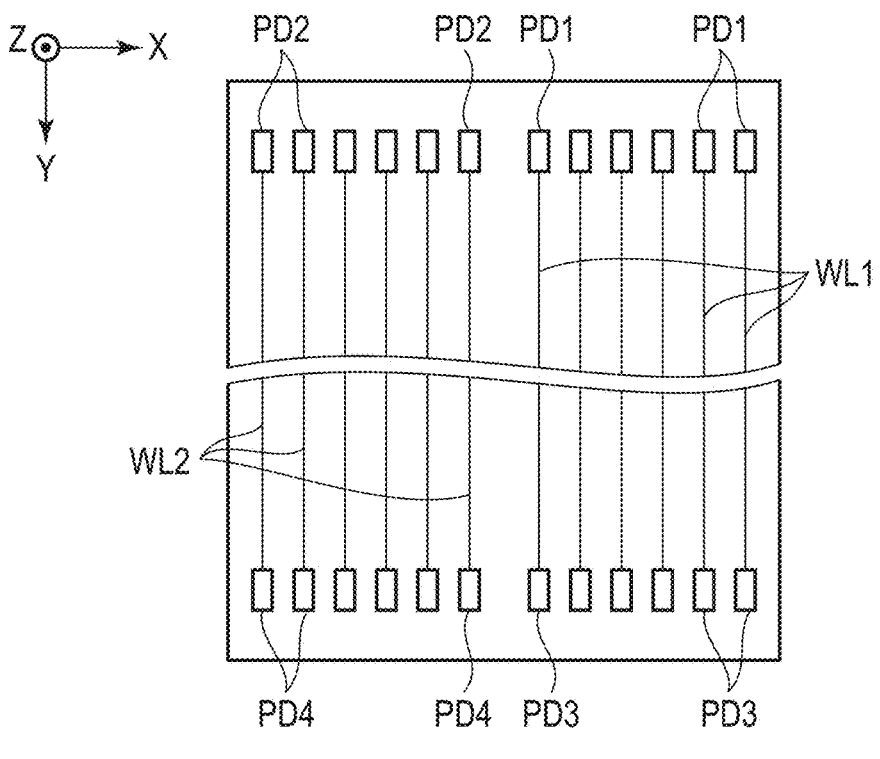
FIG. 14 is a plan view showing the wiring substrate of FIG. 13, illustrating a plurality of wiring lines and a plurality of pads.

FIG. 14 is a plan view showing the wiring substrate F2 in FIG. 13, illustrating the plurality of wiring lines WL1 and WL2 and the plurality of pads PD1, PD2, PD3, and PD4. As shown in FIG. 14, a group of the plurality of pads PD1 and a group of a plurality of pads PD2 are adjacent to each other in the first direction X. Similarly, a group of the plurality of pads PD3 and a group of a plurality of pads PD4 are adjacent to each other in the first direction X.

The plurality of wiring lines WL1 and WL2 are arranged in the first direction X. Unlike the above-described embodiment (FIG. 12), the wiring lines WL1 and WL2 do not need to overlap in the third direction Z. Since the wiring lines WL1 and WL2 can be formed in the same layer, the number of stacked layers of the wiring substrate F2 can be reduced and the structure of the wiring substrate F2 can be simplified.

In modified example 1, the same advantages as those of the above-described embodiment can also be obtained. When the structure of the wiring substrate F2 is simplified, for example, the wiring substrate F2 can be formed without the conductive layer CL3. For this reason, increase in internal resistance of the wiring substrate F2 can be suppressed.

Modified Example 2 of the Embodiment

Next, the display device 1 according to modified example 2 of the above-described embodiment will be described. The display device 1 is configured in the same manner as the above-described embodiment except for constituent elements to be described in modified example 2. FIG. 15 is a circuit diagram showing the display device 1 according to modified example 2, illustrating the first electrode EL1, and the like.

As shown in FIG. 15, compared with the above-described embodiment (FIG. 3), the display panel 2 is large in size in the first direction X, and the display device 1 further comprises a driver IC chip IC2, a wiring substrate Fb, a wiring substrate F5, a wiring substrate F6, and a wiring substrate F7. The driver IC chip IC2 is constituted in the same manner as the driver IC chip IC1, and the wiring substrate Fb is constituted in the same manner as the wiring substrate Fa.

Each of the potentials of the first power line SL1 and the second power line SL2 is fixed via seven wiring substrates F1 to F7. Even if each of the first power line SL1 and the second power line SL2 becomes large in size in the first direction X, each of the potentials of the first power line SL1 and the second power line SL2 can be desirably fixed by increasing the number of feeding points.

In modified example 2, the same advantages as those of the above-described embodiment can also be obtained.

Comparative Example 1

Next, the display device 1 according to comparative example 1 will be described. The display device 1 is configured in the same manner as the above-described embodiment except for constituent elements to be described in comparative example 1. FIG. 16 is a circuit diagram showing the display device 1 according to comparative example 1, illustrating the first electrode EL1, the first power line SL1, the second power line SL2, and the like.

As shown in FIG. 16, the display device 1 is formed without the wiring substrates F1 to F4. The first power line SL1 is formed without the first connection surface SA1 which functions as a pad, and is electrically connected to the pads p of the OLB. Similarly, the second power line SL2 is formed without the second connection surface SA2 which functions as a pad, and is electrically connected to the pads p of the OLB. The control module CM supplies the power to the first power line SL1 via the wiring substrate Fa, the pads p, and the like and supplies the power to the second power line SL2.

According to comparative example 1, the potential of each of the first power line SL1 and the second power line SL2 is fixed via the pads p and the like. For this reason, the feeding resistance is likely to be higher via the pads p and the like.

In addition, since the plurality of pads p are opposed to the single wiring substrate Fa, the plurality of pads p are aggregated in the first direction X. For this reason, each of the first power line SL1 and the second power line SL2 partially extends in a direction tilting from the first direction X and the second direction Y. The resistance of each of the first power line SL1 and the second power line SL2 is higher as the length of each of the first power line SL1 and the second power line SL2 is increased.

Based on above, the display device 1 capable of suppressing the degradation in display characteristics can hardly be obtained in comparative example 1.

Comparative Example 2

Next, the display device 1 according to comparative example 2 will be described. The display device 1 is configured in the same manner as the above-described comparative example 1 except for constituent elements to be described in comparative example 2. FIG. 17 is a circuit diagram showing the display device 1 according to comparative example 2, illustrating the first electrode EL1, the plurality of first power lines SL1 and SL5, the plurality of second power lines SL2, SL6, and SL7, and the like.

As shown in FIG. 17, the display panel 2 is formed without the extension line SL4. The display device 1 further comprises the wiring substrate Fb. The display panel 2 further comprises a first power line SL5, a plurality of second power lines SL6 and SL7, and the plurality of pads d of the OLB. The first power line SL5 is provided in the non-display area NDA. The first power line SL5 and the first power line SL1 sandwich the display area DA in the second direction Y.

The plurality of pads d are provided in the non-display area NDA and arranged in the first direction X. The plurality of pads d are provided in the vicinity of a side of the display panel 2 opposite to the first side EX. The plurality of second power lines SL6 and SL7 are provided between the first power line SL5 and the plurality of pads d in the non-display area NDA. Each of the first power line SL5, the second power line SL6, and the second power line SL7 is electrically connected to the wiring substrate Fb via the plurality of pads d.

In comparative example 2, the power can be supplied to the first electrode EL1 from both sides of the first power line SL1 and the first power line SL5. For this reason, the potential of the first electrode EL1 can be fixed more desirably than that in comparative example 1. Similarly, the power can be supplied to the second electrode EL2 from both sides of the second power line SL2 and the second power lines SL6 and SL7. For this reason, the potential of the second electrode EL2 can be fixed more desirably than that in comparative example 1.

Based on the above, the display device 1 capable of suppressing the degradation in display characteristics can be obtained in comparative example 2. However, the power lines, the pads, the wiring substrates, and the like need to be provided on the display device 1 so as to sandwich the display area DA in the second direction Y. For this reason, attention needs to be paid to an issue that the use of the display device 1 is limited. In addition, in the use of transparency, attention needs to be paid to an issue that the arrangement of the wiring substrate Fb as shown in FIG. 17 is largely restricted.

Comparative Example 3

Next, the display device 1 according to comparative example 3 will be described. The display device 1 is configured in the same manner as the above-described comparative example 1 except for constituent elements to be described in comparative example 3. FIG. 18 is a circuit diagram showing the display device 1 according to comparative example 3, illustrating the first electrode EL1, the first power line SL1, the second power line SL2, and the like.

As shown in FIG. 18, the display device 1 further comprises wiring substrates Fb and Fc. The plurality of pads p are aggregated in three areas. Each of the first power line SL1 and the second power line SL2 does not need to extend in a direction tilting from the first direction X and the second direction Y. Since the length of each of the first power line SL1 and the second power line SL2 is not undesirably increased, the resistance of each of the first power line SL1 and the second power line SL2 can hardly be high.

In comparative example 3, however, the potential of each of the first power line SL1 and the second power line SL2 is fixed via the pads p and the like. In comparative example 3, the display device 1 capable of suppressing the degradation in display characteristics can hardly be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel including:
    a basement located in a display area and a non-display area outside the display area;
    a plurality of pixels arranged above the basement and located in the display area;
    a plurality of pads arranged above the basement and located in the non-display area; and
    a first power line arranged above the basement, located between the display area and the plurality of pads in the non-display area, and including a first connection surface;
a first wiring substrate opposed to the first connection surface; and
a first conductive material located between the first connection surface and the first wiring substrate to connect the first power line with the first wiring substrate.

2. The display device of claim 1, further comprising:
a second wiring substrate; and
another first conductive material,
wherein
the first power line further includes another first connection surface separated from the first connection surface,
the second wiring substrate is opposed to the other first connection surface, and
the other first conductive material is located between the other first connection surface and the second wiring substrate to connect the first power line with the second wiring substrate.

3. The display device of claim 1, wherein
the display panel further includes a first electrode arranged above the basement, located in the display area, and electrically connected to the first power line in the non-display area, and
the first electrode is electrically connected to the plurality of pixels.

4. The display device of claim 1, wherein
the first power line extends in a first direction, and
the display area and the plurality of pads sandwich the first power line in a second direction intersecting the first direction.

5. The display device of claim 1, wherein
the plurality of pixels are arrayed in a matrix in a first direction and a second direction intersecting each other,
the display panel further includes:
    a plurality of scanning lines arranged above the basement to extend in the first direction in the display area, each of the scanning lines electrically connected to a plurality of pixels arranged in the first direction, of the plurality of pixels;
    a plurality of signal lines arranged above the basement to extend in the second direction in the display area, each of the signal lines electrically connected to a plurality of pixels arranged in the second direction, of the plurality of pixels; and
    a plurality of peripheral lines arranged above the basement and located in the non-display area, and
each of the peripheral lines includes:
    a first connection line located between the basement and the first power line to intersect the first power line;

a second connection line electrically connected to the first connection line on one hand and electrically connected to at least one of the plurality of pads on the other hand; and a third connection line electrically connected to the first connection line on one hand and electrically connected to at least one of the plurality of signal lines on the other hand.

6. The display device of claim 1, wherein the first wiring substrate is a flexible printed circuit.

7. The display device of claim 1, wherein the first power line includes:

a first metal line;

a second metal line stacked on the first metal line; and a transparent conductive layer formed on the second metal line and including the first connection surface.

8. The display device of claim 1, further comprising:

a second conductive material, wherein the display panel further includes a second power line arranged above the basement, located between the first power line and the plurality of pads in the non-display area, including a second connection surface, and set to a potential different from a potential of the first power line, the first wiring substrate is further opposed to the second connection surface, and the second conductive material is located between the second connection surface and the first wiring substrate to connect the second power line with the first wiring substrate.

9. The display device of claim 8, wherein the display panel further includes a second electrode arranged above the basement, located in the display area, intersecting the first power line, and electrically connected to the second power line in the non-display area, and the second electrode is electrically connected to the plurality of pixels.

10. The display device of claim 8, wherein each of the first power line and the second power line extends in a first direction, and the display area and the plurality of pads sandwich the first power line and the second power line in a second direction intersecting the first direction.

11. The display device of claim 10, wherein the first connection surface and the second connection surface are arranged in the second direction.

12. The display device of claim 10, wherein the first connection surface and the second connection surface are arranged in the first direction.

* * * * *